(12) United States Patent
Wang et al.

(10) Patent No.: US 11,528,820 B2
(45) Date of Patent: Dec. 13, 2022

(54) LOW PROFILE COMPUTER SUPPORT

(71) Applicant: Apple Inc., Cupertino, CA (US)

(72) Inventors: Paul X. Wang, Cupertino, CA (US); Abidur R. Chowdhury, San Francisco, CA (US); Adam T. Garelli, Morgan Hill, CA (US); Bart K. Andre, Palo Alto, CA (US); Dinesh C. Mathew, San Francisco, CA (US); Keith J. Hendren, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/079,334

(22) Filed: Oct. 23, 2020

(65) Prior Publication Data

US 2021/0289645 A1 Sep. 16, 2021

Related U.S. Application Data

(63) Continuation-in-part of application No. 16/437,858, filed on Jun. 11, 2019, now abandoned.

(51) Int. Cl.
*H05K 5/02* (2006.01)
*H05K 5/00* (2006.01)
*G06F 1/18* (2006.01)
*F16M 11/38* (2006.01)

(52) U.S. Cl.
CPC .......... *H05K 5/0234* (2013.01); *F16M 11/38* (2013.01); *G06F 1/181* (2013.01); *H05K 5/0017* (2013.01); *H05K 5/023* (2013.01); *H05K 5/0226* (2013.01); *F16M 2200/04* (2013.01); *G06F 2200/163* (2013.01)

(58) Field of Classification Search
CPC .... H05K 5/0234; H05K 5/0017; H05K 5/023; H05K 5/0226; F16M 11/38; F16M 2200/04; G06F 1/181; G06F 2200/163
See application file for complete search history.

(56) References Cited

U.S. PATENT DOCUMENTS

| | | | |
|---|---|---|---|
| 6,031,714 A * | 2/2000 | Ma ........................ | G06F 1/1601 248/924 |
| 6,353,529 B1 * | 3/2002 | Cies ...................... | G06F 1/1616 248/917 |
| 6,430,038 B1 | 8/2002 | Helot et al. | |
| 6,807,050 B1 * | 10/2004 | Whitehorn ............ | G06F 1/1601 361/679.41 |
| 7,766,288 B2 | 8/2010 | Kim et al. | |

(Continued)

*Primary Examiner* — Abhishek M Rathod
(74) *Attorney, Agent, or Firm* — Dorsey & Whitney LLP

(57) ABSTRACT

Low-profile computer supports include features to reduce the thickness and improve the portability or storage capability of a computer system while it is disassembled, packaged, shipped, or moved. Some computer systems have a computing device and a dock device that can be stored and moved separately or that can store or support accessories associated with the computer system. Some computer systems have a movable stand configured to transition between a collapsed state and a deployed or standing state. Some stands include handles or grips for moving the computer systems while collapsed. Other computer systems include handles or grips to provide areas to more easily carry the computer systems. The handles or grips can have features such as a flexible material to hide or mask their appearance on the computer system.

17 Claims, 21 Drawing Sheets

(56) References Cited

U.S. PATENT DOCUMENTS

| | | | |
|---|---|---|---|
| 8,783,641 B2* | 7/2014 | Lin | F16M 11/10 248/463 |
| 9,066,442 B2* | 6/2015 | Huebner | H05K 7/16 |
| 9,408,317 B1* | 8/2016 | Luo | F16M 11/046 |
| 9,668,611 B2* | 6/2017 | Zhitnitsky | F16M 11/38 |
| 9,685,984 B1* | 6/2017 | Majumdar | F16M 11/10 |
| 10,221,898 B2* | 3/2019 | Castillo | F16D 27/108 |
| 10,324,497 B1* | 6/2019 | Perelli | G06F 3/0383 |
| 2005/0077439 A1* | 4/2005 | Quijano | F16M 11/10 248/121 |
| 2007/0210221 A1* | 9/2007 | Kim | F16M 11/2064 248/124.1 |
| 2007/0217135 A1 | 9/2007 | Chuang et al. | |
| 2008/0251659 A1 | 10/2008 | Matias | |
| 2010/0051775 A1 | 3/2010 | Wu et al. | |
| 2011/0050063 A1* | 3/2011 | Wang | H04N 1/00562 312/351.1 |
| 2011/0297566 A1 | 12/2011 | Gallagher et al. | |
| 2012/0176741 A1 | 7/2012 | Wu et al. | |
| 2012/0188693 A1* | 7/2012 | Chiang | G06F 1/166 361/679.01 |
| 2012/0248048 A1 | 10/2012 | Wu et al. | |
| 2013/0112818 A1 | 5/2013 | Hsu | |
| 2013/0144446 A1 | 6/2013 | Rihn et al. | |
| 2013/0181903 A1* | 7/2013 | Hsu | G06F 1/1662 248/122.1 |
| 2014/0332418 A1* | 11/2014 | Cheung | H04M 1/04 206/45.2 |
| 2014/0353453 A1 | 12/2014 | Quijano et al. | |
| 2015/0215438 A1* | 7/2015 | Wallace | G06F 1/1626 455/575.1 |
| 2015/0282354 A1* | 10/2015 | Spollen | H05K 5/03 206/45.2 |
| 2015/0375894 A1* | 12/2015 | Idehara | G06F 1/1626 206/45.24 |
| 2016/0239048 A1* | 8/2016 | Mehandjiysky | G06F 1/1635 |
| 2018/0003245 A1 | 1/2018 | Castillo et al. | |
| 2018/0052498 A1* | 2/2018 | Nakagaki | G06F 1/1681 |
| 2018/0299923 A1 | 10/2018 | Kuo | |
| 2019/0258300 A1* | 8/2019 | Gerardi | G06F 1/1679 |
| 2020/0063915 A1 | 2/2020 | Lederer | |

* cited by examiner

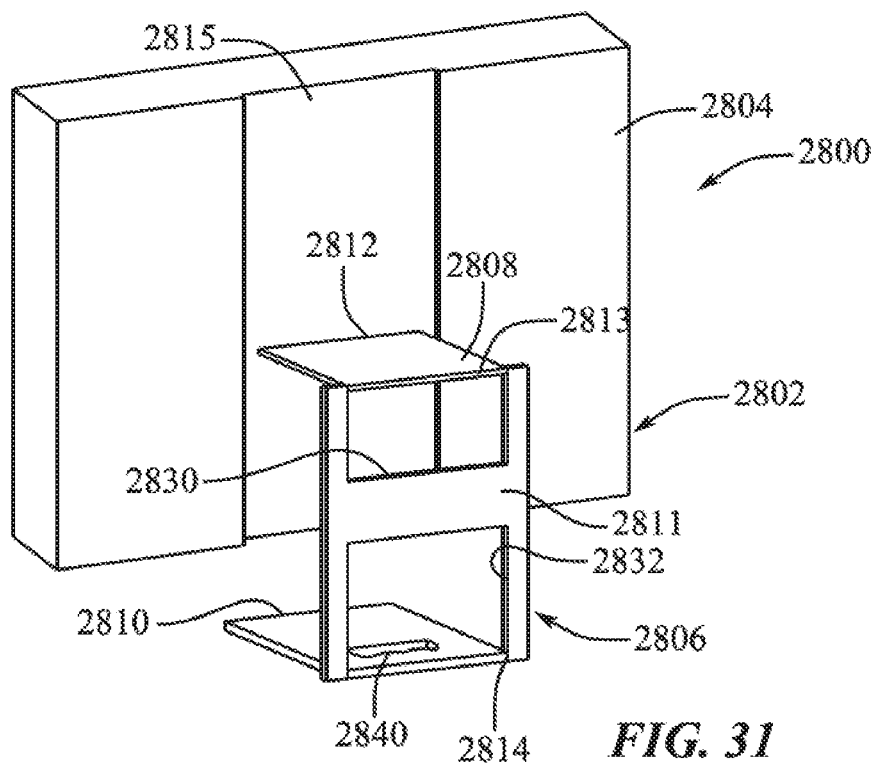
FIG. 31
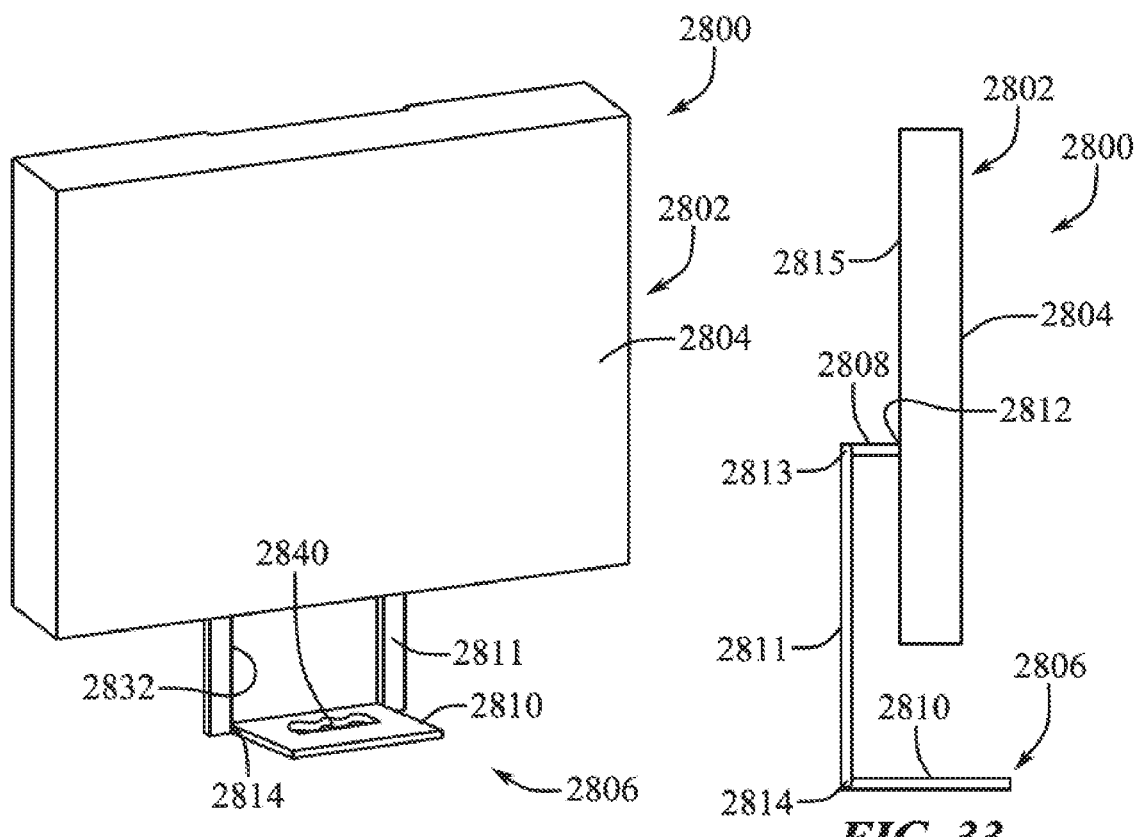
FIG. 32
FIG. 33

LOW PROFILE COMPUTER SUPPORT

CROSS-REFERENCE TO RELATED APPLICATION(S)

This is a continuation-in-part of U.S. patent application Ser. No. 16/437,858, entitled "Low Profile Computer Support," filed 11 Jun. 2019, the disclosure of which is hereby incorporated by reference in its entirety.

FIELD

The described embodiments relate generally to supports and portability-enhancing features for computing devices. More particularly, the present embodiments relate to docks, stands, handles, and related supports that are foldable, collapsible, or separable from their associated computing devices.

BACKGROUND

Over the past several decades, computing devices have drastically advanced in their power and efficiency. Computer parts have also been miniaturized, and their housings and stands have likewise progressively become thinner, lighter, and more portable. Today's desktop computers are made smaller, thinner, and lighter than ever before.

In some ways, the reduced the size of a computing device negatively impacts its portability. Device makers reduce thickness of their devices while also increasing display sizes. Over time, this has produced sleeker and thinner devices with large displays, but the pursuit of thinness, coupled with large displays, has led to products that can be overly difficult to move and inefficient to package and transport. Additionally, stands and supports for the computing devices often inefficiently take up weight and space as compared to the highly optimized remainder of the computing device with which they are used. Accordingly, there is a constant need for improvements to computing device stands, supports, and related components.

SUMMARY

An aspect of the disclosure relates to a computing system comprising a computing device and a dock device. The computing device can include a computer housing having a computer housing thickness, a display positioned in the computer housing, and a computer electrical connector, with the computer electrical connector being positioned on a surface of the computer housing. The dock device can include a dock housing removably positionable under and in contact with the computer housing, with the dock housing having a dock housing thickness, and a dock electrical connector positioned on the dock housing. While the dock device is in contact with the computing device, the dock electrical connector contacts the computer electrical connector and the display is oriented upright, and the computer housing thickness is greater than or equal to the dock housing thickness.

Another aspect of the disclosure relates to a computing device comprising a housing having a rear side, a display device positioned in the housing, and a movable stand having a first segment, a second segment, a first hinge assembly pivotally joining the first segment to the rear side of the housing, and a second hinge assembly pivotally joining the first segment to the second segment, with the movable stand being movable between a first position relative to the housing and a second position relative to the housing. In the first position, the first and second segments are collapsed against the rear side of the housing, and in the second position, the first and second segments are configured to support the housing on a horizontal surface with the display device in an upright orientation.

Yet another aspect of the disclosure relates to a computing device comprising a display, a housing containing the display, with the housing having a side surface and a grip portion positioned in the side surface and with the grip portion having a finger support surface sized to rest on four side-by-side fingers of a hand of a user, and a flexible material covering the grip portion, the grip portion being grippable by the four side-by-side fingers of the hand of the user while the fingers deform the flexible material.

A further aspect of the disclosure relates to a computing device comprising a housing having a front side, a rear side and an overall thickness defined between the front side and the rear side. A stand is attached to the housing and movable between a first position relative to the housing and a second position relative to the housing, the stand having a total thickness. When the stand is in the first position, the stand supports the housing on a horizontal support surface while the housing is above and space away from the horizontal support surface. When the stand is in the second position, the total thickness of the stand lies within the overall thickness of the housing.

Another aspect of the disclosure relates to a computing device comprising a housing having a front surface. A stand is attached the housing and movable between a first position relative to the housing and a second position relative to the housing. When the stand is in the first position, the stand spaces the housing away from a horizontal support surface. When the stand is in the second position the stand is stowed against the housing. The stand is configured to transition from the first position to the second position by in response to continual application of a force to a point on the front surface of the housing, wherein the force moves the housing and stand from the first position to the second position.

Yet a further aspect of the disclosure relates to a computing device comprising a housing, a display positioned in the housing, and a stand having a first segment and a second segment. A pivot mechanism pivotally couples the housing with the stand. The pivot mechanism includes a first pivot plate coupled to the housing and a second pivot plate coupled to the first segment of the stand. A pivot cylinder is coupled to the first pivot plate and the second pivot plate. The pivot cylinder is positioned to define a gap between the pivot cylinder and the first segment of the stand. In some embodiments, the gap is uniform along a width of the first segment of the stand. In some embodiments, the first segment of the stand has a lateral width that is greater than either a lateral width of the first pivot plate or a lateral width of the second pivot plate. In some embodiments, a handle is coupled with the pivot cylinder.

BRIEF DESCRIPTION OF THE DRAWINGS

The disclosure will be readily understood by the following detailed description in conjunction with the accompanying drawings, wherein like reference numerals designate like structural elements, and in which:

FIG. 31 shows a rear isometric view of the computer system of FIG. 28 in a deployed configuration.

FIG. 32 shows a front isometric view of the computer system of FIG. 31.

FIG. 33 shows a side view of the computer system of FIG. 31.

DETAILED DESCRIPTION

Figure 1:
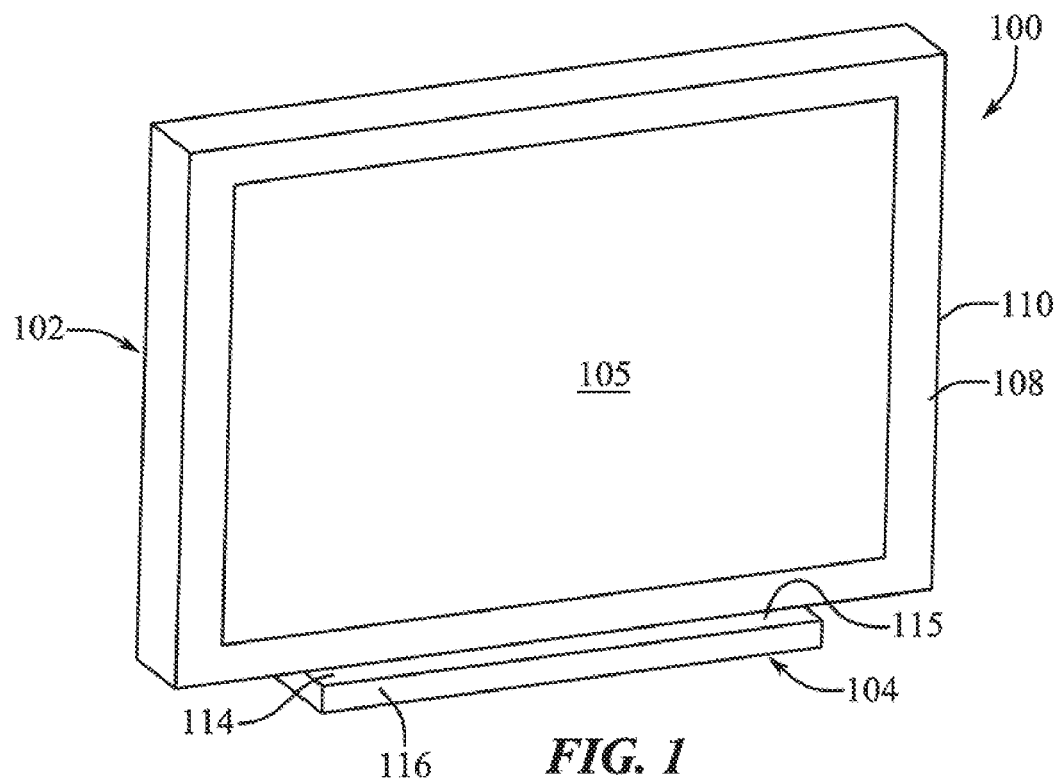
FIG. 1 shows a front isometric view of a computer system.

Reference will now be made in detail to representative embodiments illustrated in the accompanying drawings. It should be understood that the following descriptions are not intended to limit the embodiments to one preferred embodiment. To the contrary, the present disclosure is intended to cover alternatives, modifications, and equivalents as can be included within the spirit and scope of the described embodiments as defined by the appended claims.

The following disclosure relates to low-profile docks, stands, handles, supports, and related components for computing devices. The computing devices can include desktop computers, all-in-one computers, portable computers, laptop computers, notebook computers, displays (i.e., monitors), tablet computers, smartphones or other handheld computers, related devices, and combinations thereof. These devices or components can improve the portability of a computing device, can reduce its minimum packaging thickness, and can provide additional utility.

Generally, although computers have become thinner and smaller, their stands have not followed suit. This is especially the case with all-in-one computers that have a display built into a desktop computer housing. These devices are intended to be beautiful tools with aesthetic appeal even when viewed from the side and back of the display. Although these computers can have a relatively thin housing, the stand portion of the device housing can increase the overall horizontal depth dimension of the device and, correspondingly, the overall volumetric envelope. The depth dimension can have a strong impact on the size and efficiency of the packaging of the device for shipping, storage, and retail applications. Accordingly, reducing the horizontal depth of the device without sacrificing stability and usability of the device can improve efficiencies for device makers, sellers, and users in many ways.

Laptop computers, tablet computers, and smartphones have risen in popularity due in part to their easy portability. Desktop computers, all-in-one computers, and the like often have advantages over these more traditionally portable devices such as larger displays, more powerful hardware components, and more comfortable interface devices. Aspects of the present disclosure relate to improvements to the portability and ease of use of computing devices traditionally used on a desktop. Thus, these desktop computers that incorporate aspects of the disclosure can be more easily used in non-traditional settings or for non-traditional purposes.

Generally, these devices are intended to be used in an upright position. As used herein, an "upright" configuration is a configuration in which an elongated height dimension of the device is more parallel than perpendicular relative to the gravitational direction. For example, a computing device is upright when it is in a vertical orientation similar to a picture frame hanging on a wall or supported by a kickstand. A computer device having a display is in an upright configuration when its display is held up and facing the user as a computer monitor is conventionally used.

In many cases, the stand portions of desktop computers lack functionality beyond supporting the housing of the computer or display. Aspects of the present disclosure relate to improving the utility of stands or docks of the computer by integrating additional features into the stand portion of the system such as device chargers, cord or cable management features, or computer components.

One aspect of the disclosure relates to a two-part computing system comprising a computing device and a dock device. The two devices can be separably connectable to each other such that, when disassembled, the dock and computer can have equal thicknesses (or the dock can be thinner than the computing device). Thus, the system can be disassembled to reduce its packing, storage, and shipping thickness. Additionally, the dock device can provide additional functionality to the computing device, such as by providing an interface for accessories or by storing computer components such as a power supply, input devices, speakers, wireless chargers, device interfaces (e.g., input or output ports), or other components for the computing system that expand the functionality of the computing device.

Another aspect of the disclosure relates to a collapsible stand system for a computing device. The stand can be pivotally connected to the computing device and can comprise multiple points of articulation, wherein jointed segments of the stand can pivot about hinge assemblies between a thin, collapsed storage position and a broader, deployed support position that holds up the computer housing. In the storage position, the stand can add little or no thickness to the housing so that the assembly as a whole can have reduced packing, storage, and shipping dimensions. In some embodiments, the stand can also comprise features such as a carrying handle or grip that improves the portability and mobility of the computer.

Other aspects of the disclosure relate to other types of handles or carrying features for a computer that are implemented without significantly adding to the thickness or detracting from the aesthetic appeal of the device. In some embodiments, handles or grips are hidden behind stretched elastic flexible material, and the handles or grips can be accessed by elastically deforming (e.g., pressing into or folding) the flexible material. After the device is moved, the flexible material can resiliently return to its original shape that masks the presence of the carrying feature. Stretched or elastic flexible material can also be implemented in other portions of a device, such as by enclosing a space within the width or depth of a stand for the computing device. Accordingly, the flexible material can provide a desired aesthetic appearance of the outer surface of the device while also being flexible to permit its stand-based "skeleton" or other internal components to be moved, collapsed, or otherwise reconfigured as needed.

These and other embodiments are discussed below with reference to the figures. However, those skilled in the art will readily appreciate that the detailed description given herein with respect to these figures is for explanatory purposes only and should not be construed as limiting.

Figure 2:
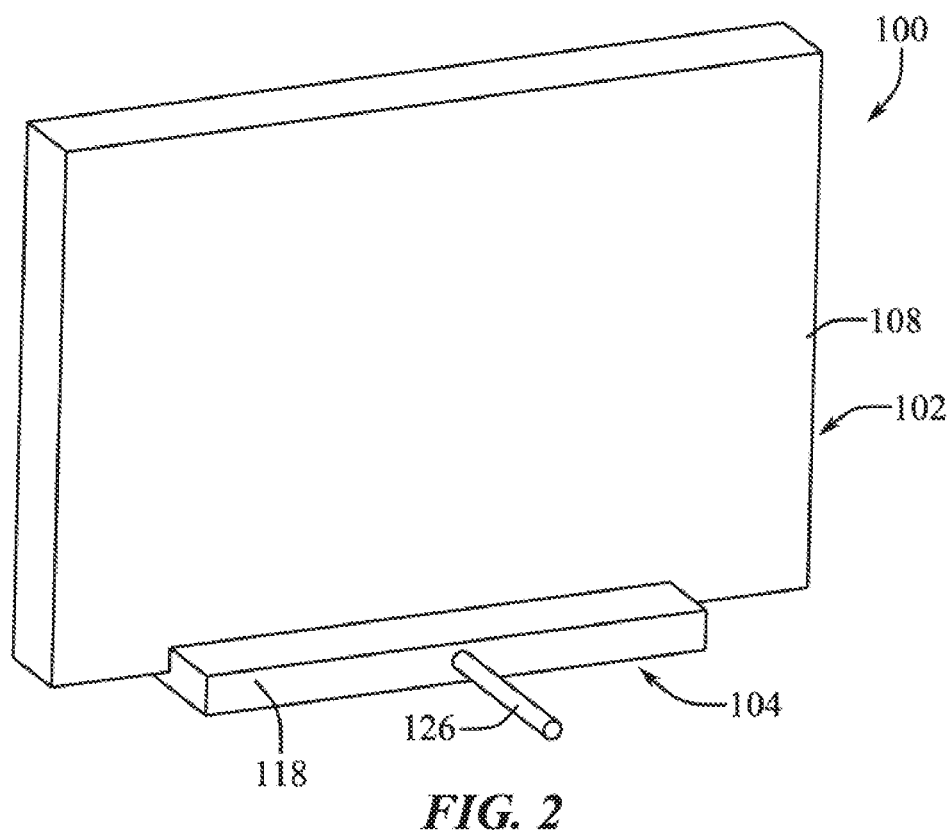
FIG. 2 shows a rear isometric view of the computer system of FIG. 1.
Figure 3:
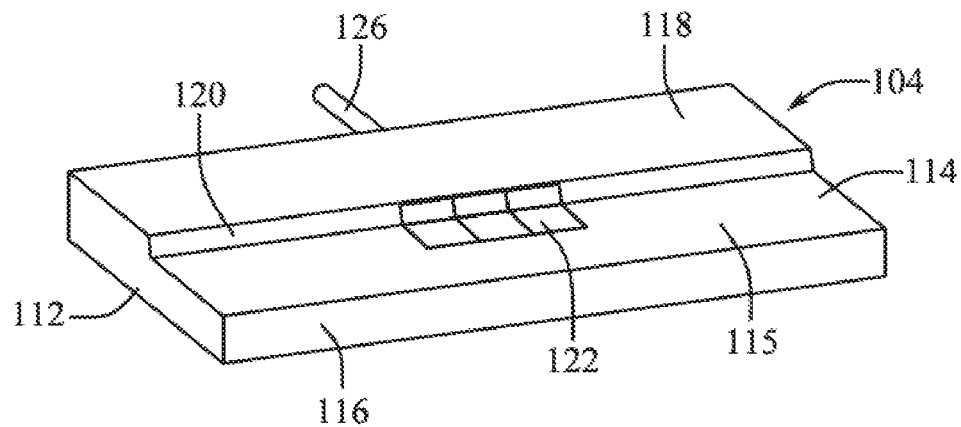
FIG. 3 shows a front isometric view of a dock device of the computer system of FIG. 1.
Figure 4:
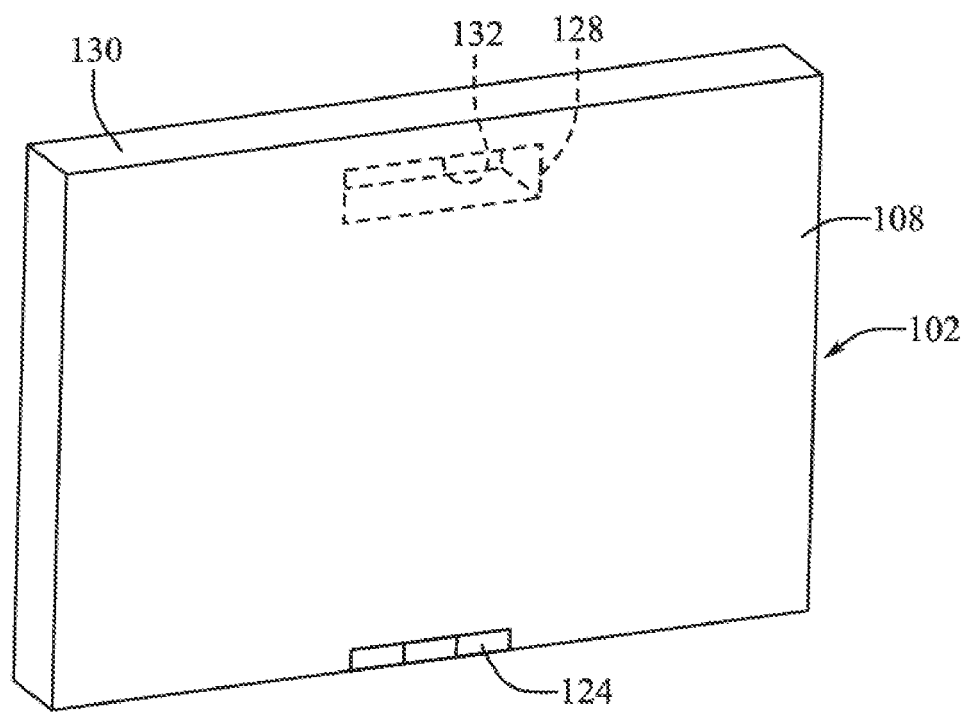
FIG. 4 shows a rear isometric view of a computing device of the computer system of FIG. 1.

FIGS. 1-4 illustrate a computing system 100 comprising a computing device 102 and a dock device 104. FIG. 1 is an isometric front view of the system 100, FIG. 2 is an isometric rear view of the system 100, FIG. 3 is an isometric view of the dock device 104, and FIG. 4 is an isometric rear view of the computing device 102.

The computing system 100 comprises two primary parts consisting of the computing device 102 and the dock device 104. In some arrangements, more parts can be implemented, such as, for example, multiple computing devices or multiple dock devices. The system 100 can function as a desktop computer or all-in-one computer, wherein the computing device 102 is configured to be substantially vertically oriented, and the dock device 104 is configured to support the computing device 102 on a horizontal support surface (e.g., a desktop surface or similar horizontal platform).

The computing device 102 can comprise a display 105 positioned within a housing 108. The display 105 can comprise a computer display such as, for example, a liquid crystal display (LCD), organic light-emitting diode (OLED) display, or comparable computer display device. The display 105 can be referred to as a monitor or display screen of the computing device 102. The housing 108 can comprise a shell to protect and cover parts of the display 105. In some embodiments, the housing 108 can comprise rigid and durable materials such as, for example, plastic, metal, ceramic, and glass materials. The housing 108 can comprise a bezel 110 (i.e., a front-facing housing) extending around a perimeter of the display 105.

As shown in FIG. 3, the dock device 104 can comprise a dock housing with a downward-facing bottom surface 112 below an upward-facing support surface 114. The dock device 104 can also have a front portion 116 that has a reduced thickness relative to a rear portion 118. The front and rear portions 116, 118 can be separated from each other by a substantially vertical support surface 120. The rear surface of the computing device 102 can be supported by and in contact with the vertical support surface 120. In some embodiments, the dock device 104 can have a constant thickness for its front and rear portions 116, 118. In some embodiments, the maximum thickness of the docking device 104 (or "height" of the docking device 104 when in an orientation of intended use) can be the same as, or less than, a maximum thickness of the computing device 102 (or "depth" of the computing device when vertically oriented). In some embodiments, the upward-facing support surface 114 can comprise a recess or groove into which the computing device 102 can be mounted.

The bottom surface 112 can be configured to support the dock device 104 and computing device 102 on a horizontal surface. In some embodiments, the bottom surface 112 can comprise feet or other extending members to support the dock device 104 on a supporting surface, and can be configured to accommodate uneven supporting surfaces.

The support surface 114 can be configured to contact the computing device 102, as shown in FIGS. 1-2. The upward-facing support surface 114 and/or the vertical support surface 120 can comprise at least one electrical connector 122. The support surface 114 can comprise a recess or other interlocking feature (not shown) configured to mechanically hold the computing device 102 in place on the dock device 104. In some embodiments, the dock device 104 can comprise internal magnetic structures (not shown) configured to be attracted to and to apply a retaining force to the computing device 102. For example, the computing device 102 can comprise a housing 108 having ferrous material or a magnet configured to be attracted to a magnet (e.g., a permanent magnet or electromagnet) in the dock device 104 (or vice versa). The magnetic structures can keep the dock device 104 centrally aligned with the computing device 102. Accordingly, the dock device 104 can hold the computing device 102 in a manner that keeps the electrical connector 122 contacting associated connectors or contacts of the housing 108.

In some embodiments, the computing device 102 may include various hardware components, such as a central processing unit, a graphics processing unit, memory (e.g., random access memory), data storage (e.g., a hard drive or solid-state drive) and associated circuitry to operably connect such components. The computing device 102 may include additional components such as one or more input devices and one or more output devices in addition to the display 105. In other embodiments, some or all of the hardware components may be housed within the dock device 104. In some embodiments, each of the computing device 102 and the dock device 104 may include hardware components such as described above.

In some embodiments, the dock device 104 can comprise an input device. The upward-facing support surface 114 can comprise a touch-sensitive panel or set of buttons configured to control functions of the computing device 102. Thus, the dock device 104 can comprise a portion that is accessible by an instrument of a user (e.g., a finger, hand, or stylus) for user interaction with the dock device 104. In some embodiments, the support surface 114 extends in a forward direction relative to the bottom edge of the computing device 102 in a manner providing an uncovered input surface 115 (see FIG. 1) that the user instrument can move an instrument across or press into to provide an input. In some embodiments, the input device can comprise a display or a dynamic function row. The display can comprise at least one internal light source that is configured to illuminate symbols in or through the surface of the input device portion of the dock device 104. A user instrument can interact with the symbols such as by contacting the support surface 114 and being sensed by a sensor within the dock device 104 (e.g., a capacitive sensor) or by pressing into the support surface 114 and actuating a switch within the dock device 104. In some embodiments, the support surface 114 comprises a flexible material (e.g., a woven material, textile, flexible sheet, rubber, or fabric) that can be elastically deformed by the user instrument when the user interacts with the input device. For example, the flexible material can cover a button or switch to be pressed by the user, and a light source can backlight a symbol indicating a function of the button, such as a power symbol. A user pressing the button can provide input or instructions to the computing device 102 via the dock device 104.

The electrical connector 122 can comprise electrically conductive contacts configured to provide electrical communication with the computing device 102. As shown in FIG. 4, the computing device 102 can comprise an electrical connector 124 positioned on the housing 108 in a location configured to releasably remain in contact the electrical connector 122 of the dock device 104. In this embodiment, the dock device 104 comprises an electrical connector 122 on the vertical support surface 120, and the electrical connector 124 is therefore on a rear-facing surface of the housing 108 configured to come into contact with the electrical connector 122 and the vertical support surface 120. In some cases, the electrical connector 124 can be on a top, bottom, or lateral side surface of the housing 108. The electrical connectors 122, 124 can be aligned and in contact when the computing device 102 is mounted to the dock device 104. Magnetic structures or mechanically interlocking structures on the devices 102, 104 can keep the connectors 122, 124 aligned and in contact with each other.

The electrical connectors 122, 124 can provide electrical communication between the devices 102, 104 without either device needing a cable or cord that extends from one device to the other. Accordingly, the computing device 102 and dock device 104 can have a cleaner and simpler appearance, and their connection is not susceptible to cable bending failures or other issues related to cable connections. Although the electrical connectors 122, 124 are shown having three parts or connection pads in the figures, any number of electrical contacts can be used, depending on the amount and type of power and data being transferred between the devices 102, 104.

In some embodiments, electrical signals can be exchanged between the dock device 104 and the computing device 102 in place of, or in addition to, the electrical connectors 122, 124. The electrical signals can be wireless signals, such as, for example, wireless electrical power signals exchanged between wireless charging apparatuses in the dock device 104 and the computing device 102. Accordingly, the computing device 102 can provide electrical charge to the dock device 104 or vice versa. In some embodiments, the wireless signals can include control and information signals wirelessly exchanged between the devices 102, 104. The control and information signals can be stored by or change the operation of the devices 102, 104. Wireless control and information signals can be exchanged using at least one short-range wireless electrical communication protocol such as, for example, Wi-Fi, BLUETOOTH®, ZIGBEE®, and related protocols.

In some embodiments, the dock device 104 can comprise components that provide additional functionality to the computing device, such as by providing an interface for accessories (e.g., universal serial bus (USB) ports, a card reader, an audio or microphone jack, an external monitor connection, and similar interfaces for external devices and accessories) or by storing computer components such as a power supply, input devices, speakers, wireless chargers, device interfaces (e.g., input or output ports), or other components that expand the functionality of the computing device 102. In some embodiments, the computing device 102 does not comprise one or more of these interfaces or components on its own. For example, in some embodiments, the computing device 102 can lack its own power supply and the dock device 104 can comprise a power supply (e.g., connected to power cord 126) used to power the computing device 102 when the two devices 102, 104 are assembled. In other cases, the devices 102, 104 can have some components that duplicate the functions of each other. For example, the computing device 102 can comprise a power supply (e.g., a battery) and the dock device 104 can comprise a power supply (e.g., a conventional utility-grid-connected power supply). In another example, the computing device 102 and dock device 104 can both comprise a similar power supply, and only one of the power supplies is used while the devices are assembled.

In some arrangements, the computing device 102 can comprise a grip 128 or handle feature recessed into a back surface of the housing 108. The grip 128 can be positioned near an edge of the housing 108, such as the top edge 130, so that the grip 128 can be easily gripped by a user lifting the housing 108. The grip can be sized and shaped to receive the tips of four side-by-side average-sized fingers of an adult user's hand when they are received into the recess and press against or are pulled toward a finger-contacting surface (e.g., 132) within the grip 128. With a grip 128 near an edge (e.g., 130), the user's thumb can also extend into contact with the top surface of the housing 108 or around the housing 108 into contact with a front surface of the computing device 102.

In some embodiments, the rear surface of the housing 108 can be at least partially covered with a flexible material such as a sheet of a textile or similar woven structure, a rubber sheet (or a sheet of another rubber-like elastic plastic material). The flexible material can extend across the recess of the grip 128 and can thereby hide the grip 128 from view. A hand can press against or into the flexible material to deform the flexible material to allow their fingers to enter into the grip 128, as explained in further detail below in connection with FIGS. 24-27.

FIGS. 5-8 show another embodiment of a computing system 500. The computing device 502 can be similar to the computing device 102 of FIG. 1. Elements of FIGS. 5-8 having similar numbering to FIGS. 1-4 can perform similar functions. The dock device 504 can define a void underneath the upward-facing support surface 514. The void can be within a recess 532 extending inward and upward from the bottom surface 512 of the dock device 504. An open space can therefore be defined between the dock device 504 and a support surface underneath the dock device 504.

In some embodiments, the recess 532 can be sized and configured to receive an input device 506 for the system 500. The input device 506 can comprise a low-profile keyboard, tablet computing device, or wedge-shaped pad configured to fit underneath the downward-facing surface 534 (see FIG. 8) of the dock device 504. The input device 506 can comprise an input surface 536 having one or more input regions (e.g., 538, 540) configured for interaction with a user instrument. For example, one of the input regions 538 can be a touch-sensitive interface (e.g., a capacitive touch pad or stylus input surface) and another input region 540 can be a keyboard interface or another touch-sensitive interface. The input device 506 can also have a single large touch-sensitive interface, such as, for instance, a capacitive touch pad that extends across both regions 538, 540.

Figure 5:
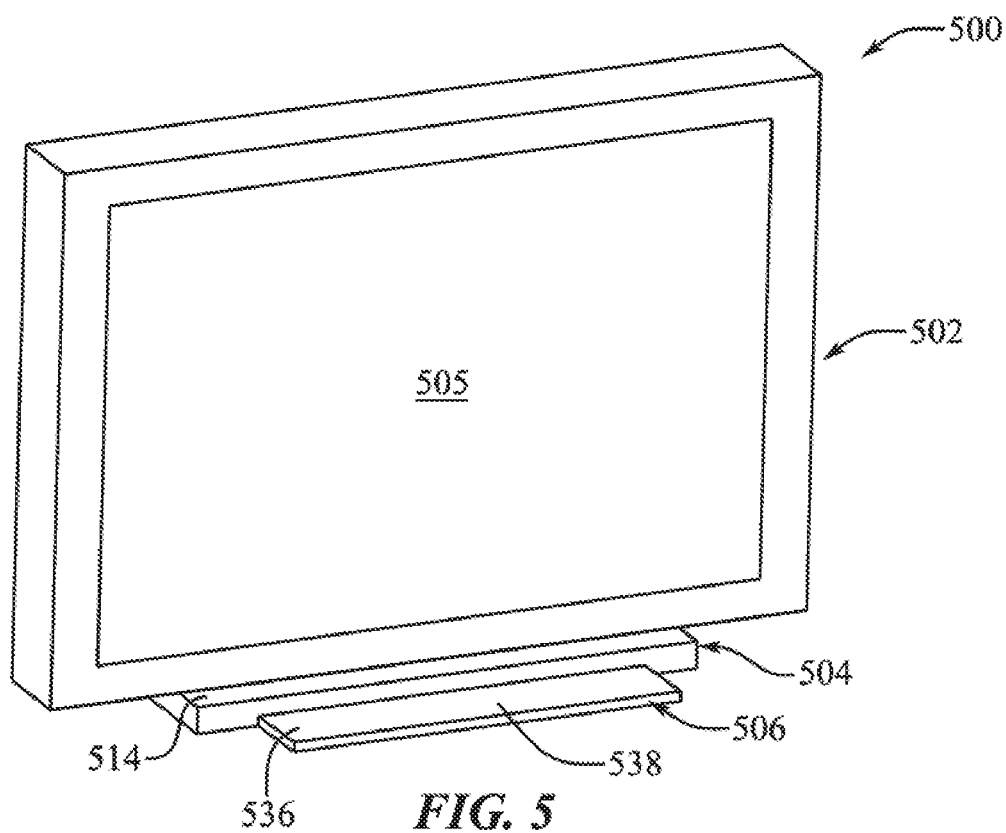
FIG. 5 shows a front isometric view of a computer system.
Figure 6:
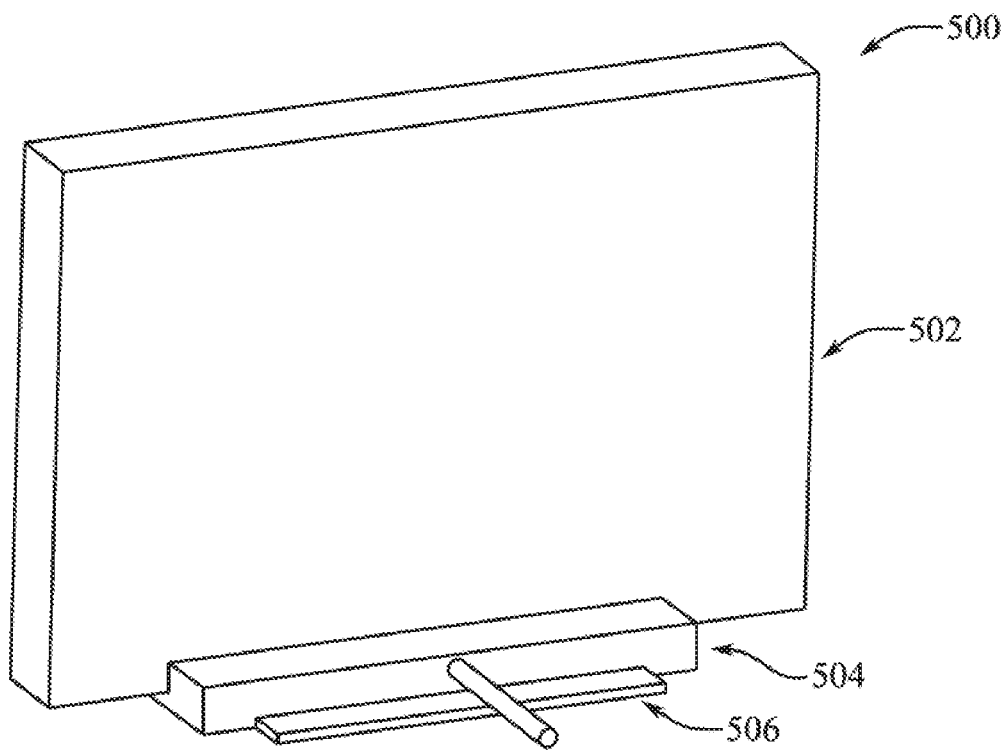
FIG. 6 shows a rear isometric view of the computer system of FIG. 5.
Figure 7:
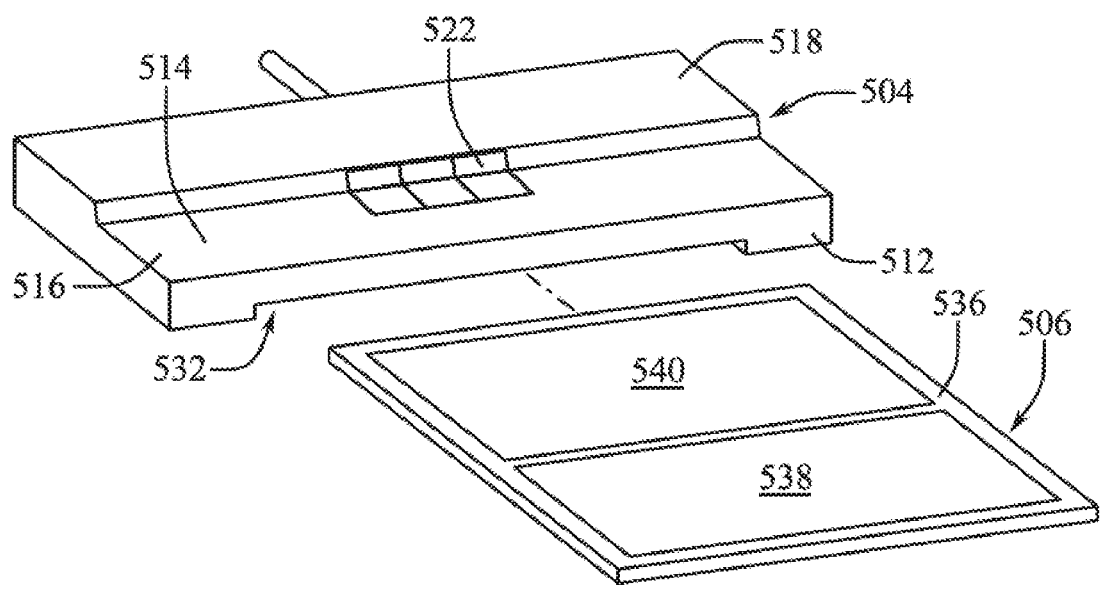
FIG. 7 shows a front isometric view of a dock device and input device of the computer system of FIG. 5.
Figure 8:
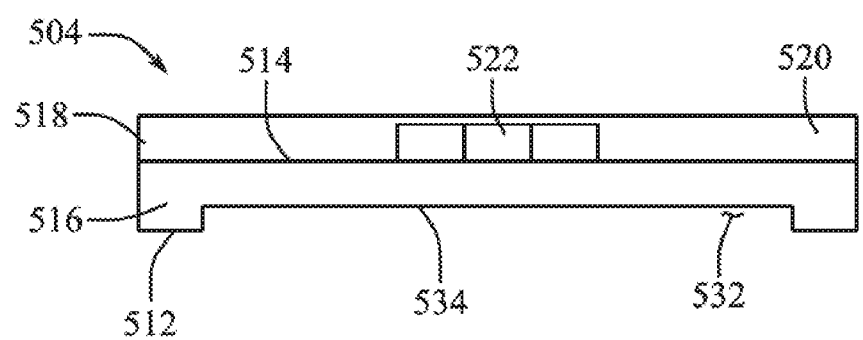
FIG. 8 shows a front view of the dock device of the computer system of FIG. 5.

The input regions 538, 540 can be sized and positioned on the input device 506 so that when the input device 506 is inserted into the recess 532, as shown in FIG. 5, at least one of the input regions 538 (or a portion of an input region) is exposed in front of the dock device 104. Accordingly, the dock device 104 can cover or conceal a portion of the input device 506 including an input region 540 of the input device 506 when the input device 506 is positioned in the recess 532. In this way, the dock device 504 can provide a storage area for the input device 506 that also keeps the input device 506 at least partially out of view. The input device 506 can also at least partially protrude from a back side of the dock device 504 while in the storage position. See FIG. 6. In some embodiments, the input device 506 does not protrude from the back side of the dock device 504. For example, the dock device 504 can have a rear wall hiding the back end of the input device 506.

With the input device 506 in the storage position, the exposed input region 538 can be used to interact with the computing device 102, such as by acting as a touchpad or touch screen interface in electrical communication with the computing device 102. The system 500 can therefore be better suited for operation in environments with a limited amount of support surface, such as a small desk, bar, or countertop. Additionally, the system 500 can have a simplified appearance as a result of the input device 506 being at least partially hidden.

In some embodiments, the entire input device 506 is concealed or covered by the dock device 504. In some cases the input device 506 can have its entire top surface covered by the dock device 504 while some portions (e.g., one or more lateral sides) are exposed. In some embodiments, the input device 506 can be positioned on top of an upward-facing support surface (e.g., 514) and can be operated from that location.

The input device 506 can comprise a wireless electrical communications interface to establish electrical communication with the dock device 504 or computing device 502. For example, the input device 506 can comprise an antenna and electronics configured to interface via BLUETOOTH®, WI-FI®, or other similar wireless communications protocols. Accordingly, the input device 506 can operate without a wired connection to the rest of the system 500. The input device 506 can also comprise an internal power source (e.g., battery) connected to a wireless charging apparatus (e.g., charging coils configured to inductively charge the power source) within the housing of the input device 506. The dock device 504 can comprise a corresponding wireless charging apparatus configured to induce the current in the input device 506. Positioning the input device 506 within the recess 532 can align the wireless charging devices in a manner enabling charging of the input device 506 while it is at least partially stored under the dock device 504. In some embodiments, the recess 532 can comprise electrical contacts or a plug or socket configured to engage electrical contacts on the input device 506. Joining the electrical contacts can allow a power source of the input device 506 to charge while in the storage position without necessarily using wireless charging. In some embodiments, the input device 506 can be charged while resting on the upward-facing support surface 514. In some embodiments, the input device 506 can be connected to the dock device 504 or computing device 502 using a wired connection.

Figure 9:
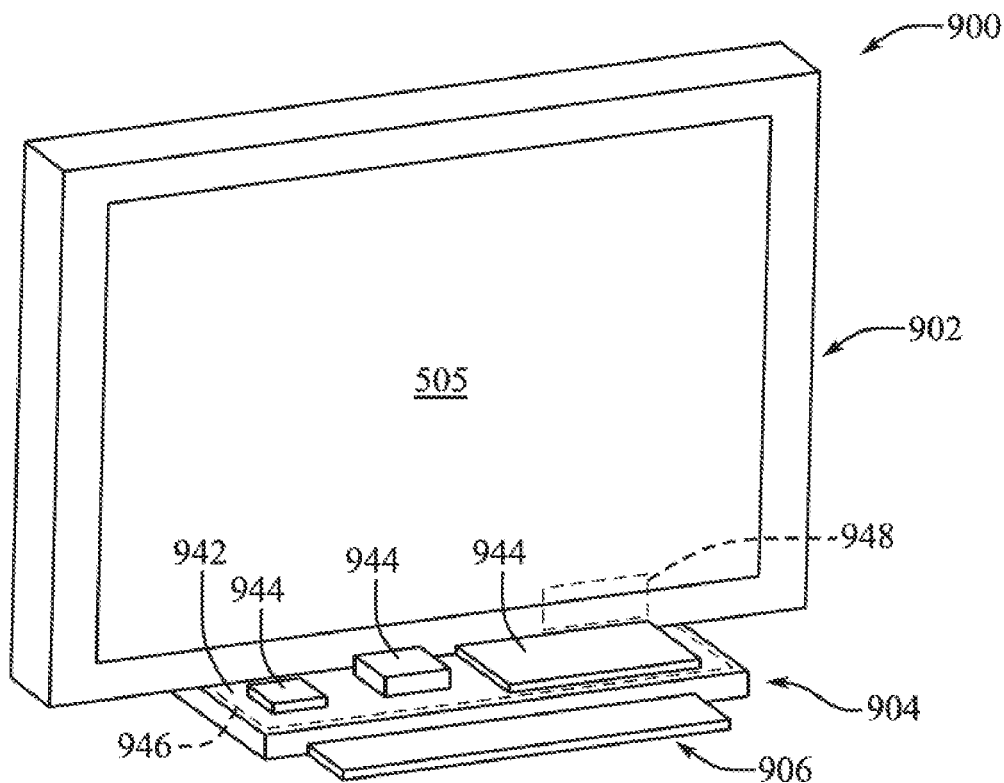
FIG. 9 shows a front isometric view of a computer system.
Figure 10:
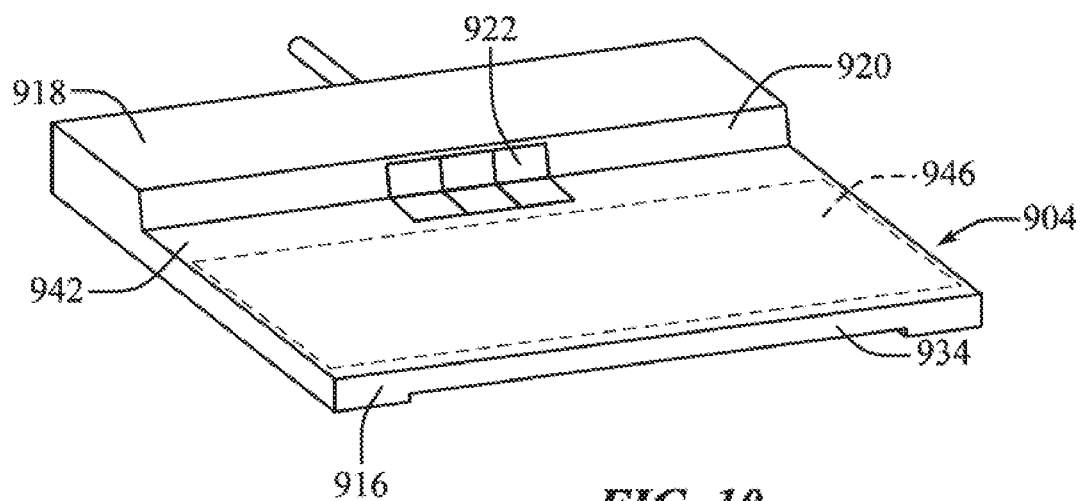
FIG. 10 shows a front isometric view of a dock device of the computer system of FIG. 9.

FIGS. 9-10 illustrate an alternate embodiment of a system 900 comparable to systems 100 and 500. Elements of FIGS. 9-10 having similar numbering to FIGS. 1-8 can perform similar functions. The computing device 902 can be positioned mounted to a dock device 904 having an extended top surface 942 as compared to support surface 114. The extended top surface 914 can support the computing device 902 at a rear end of the surface, and a front end thereof can be configured as a shelf or similar platform for external devices 944 or an input device 906. The external devices 944 can comprise devices such as a smartphone, a watch, a tablet computer, a keyboard, a mouse, an electronic pen or stylus, a battery pack, a handheld game system, a wireless headphone, a charging case, related devices, and combinations thereof. Thus, the dock device 904 can provide a storage area for small electronic devices.

The extended top surface 942 can comprise a front region 946 within which a wireless charging apparatus can be positioned. Thus, external devices 944 can be wirelessly charged while resting on the front region 946. The dock device 904 can therefore comprise multiple sets of wireless charging apparatuses, wherein a first wireless charging apparatus is configured to wirelessly charge an input device 906 or other device positioned underneath a bottom surface 934 of the dock device 904 and a second wireless charging apparatus is configured to wirelessly charge a device (e.g., one or more devices 944) positioned on top of the extended top surface 942.

In some embodiments, the first and second charging apparatuses can direct an electromagnetic field in different primary directions. For example, the first charging apparatus can direct a field downward to induce charge below the first charging apparatus, and the second charging apparatus can direct a field upward to induce charge above it. In some embodiments, a single wireless charging apparatus can selectively direct a wireless charging field in one of two directions, such as by providing charging primarily upward or downward according to the system configuration, user settings, or preferences. In various embodiments, the front region 946 can cover substantially the entire extended top surface 942, just the exposed portion of the extended top surface 942 (i.e., the portion exposed while the computing device 902 is mounted in place on the dock device 904), or a smaller subset of the exposed portion.

The dock device 904 can also provide a support surface for a portable device positioned adjacent to a front-facing surface 948 of the computing device 902. For example, the device can rest in a substantially upright orientation with a flat surface resting against the front-facing surface 948. The front-facing surface 948 can be positioned in a bezel or similar area surrounding the display 905 of the computing device 902. In some embodiments, the front-facing surface 948 is positioned on an extended or enlarged bezel portion such as an extended frontal housing portion of computing device 902. In some embodiments, the front-facing surface 948 overlaps a portion of the display 905. Accordingly, the device can cover a portion of the display 905. In some embodiments, the front-facing surface 948 can be contained entirely within the display 905. In some embodiments, the front-facing surface 948 can be contained entirely within a bezel area.

A device positioned against the front-facing surface 948 can be charged by a wireless charging apparatus within the computing device 902 near that surface 948. In some embodiments, a device positioned against the front-facing surface 948 can be in wireless electrical communication with the computing device 902 and can provide additional functionality to the operation of the computing device 902. For example, the device can extend the amount of information displayed on display 905 or can provide an alternate input device for the computing device 902.

Figure 11:
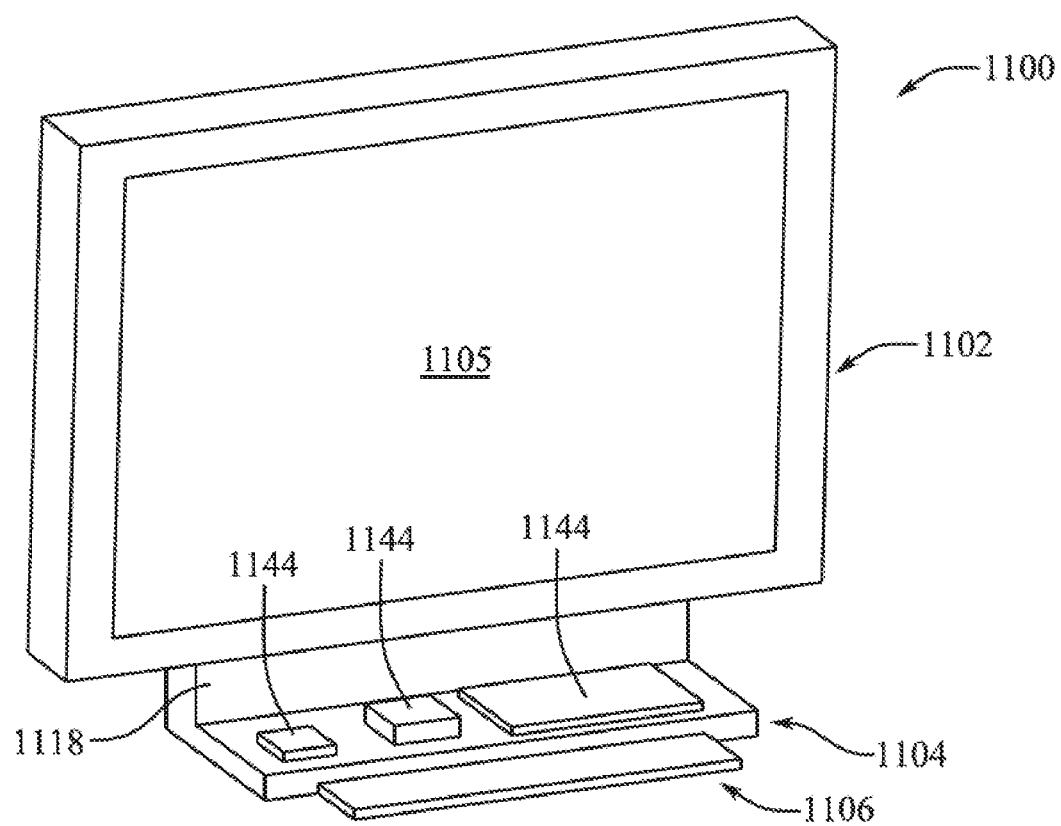
FIG. 11 shows a front isometric view of a computer system.
Figure 12:
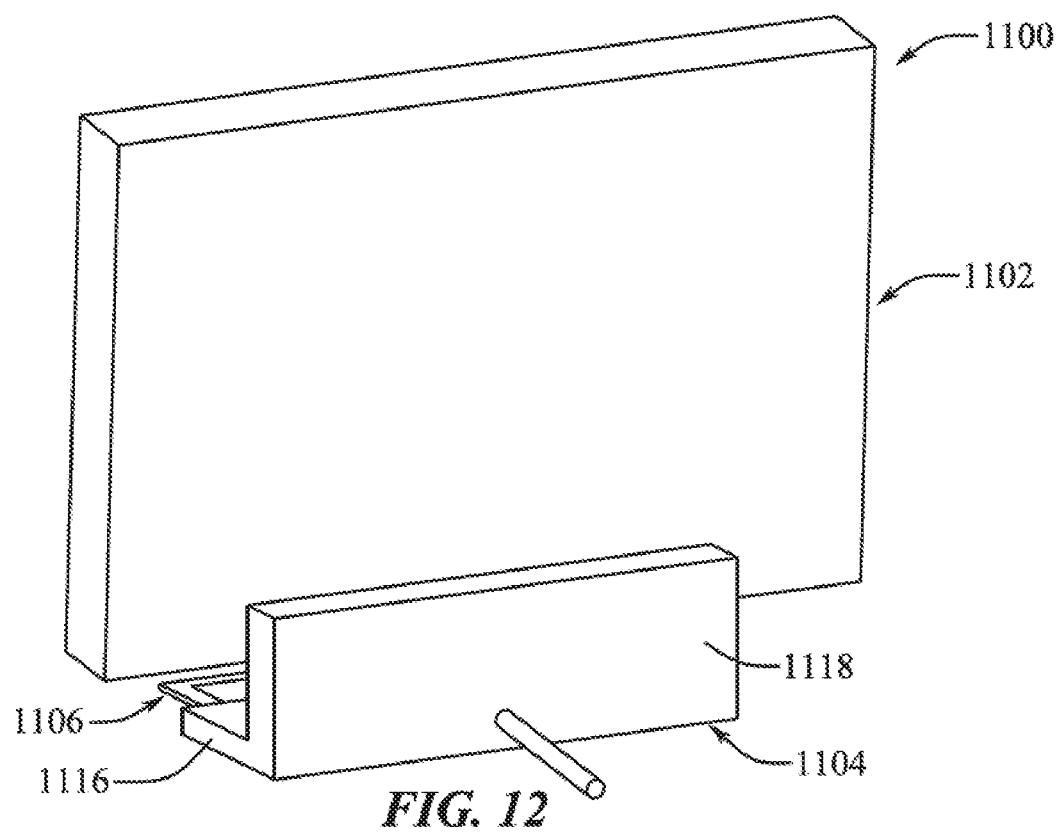
FIG. 12 shows rear isometric view of the computer system of FIG. 11.
Figure 13:
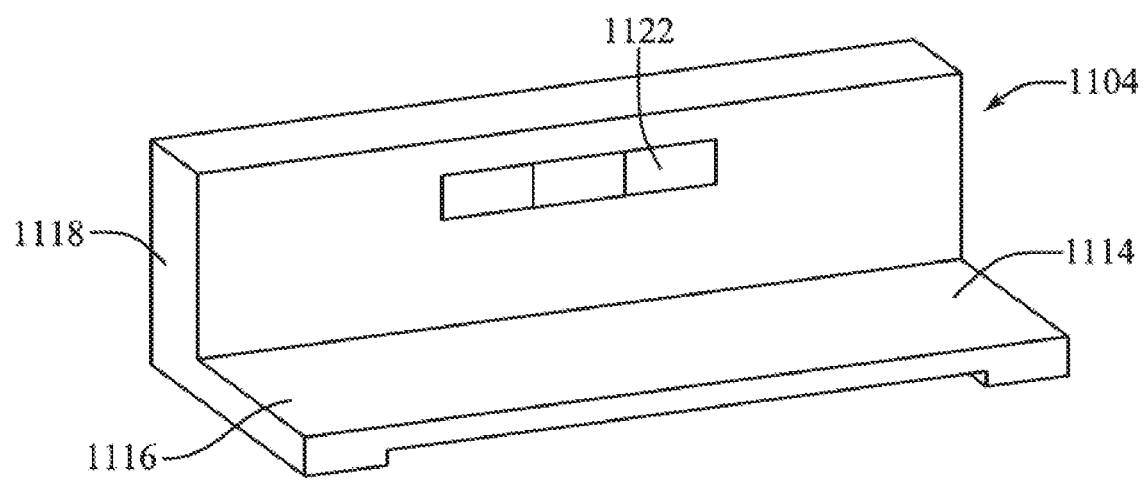
FIG. 13 shows a front isometric view of a dock device of the computer system of FIG. 11.

FIGS. 11-13 illustrate another embodiment of a system 1100 similar to systems 100, 500, and 900. Elements of FIGS. 11-13 having similar numbering to FIGS. 1-10 can perform similar functions. In this case, the dock device 1104 can comprise an extended rear portion 1118. The computing device 1102 can therefore be mounted to the extended rear portion 1118 at electrical contacts 1122 that are in a raised position relative to dock device 104. See FIG. 13. This can allow the display 1105 to be positioned higher above a support surface 1114 in a manner making it more ergonomic for certain users. In some embodiments, the computing device 1102 is positionable at multiple different locations on the dock device 1104, such as, for example, in a first position wherein the computing device 1102 contacts the upward-facing support surface 1114 or in a second position wherein the computing device 1102 is in the position shown in FIG. 11 and raised above the support surface 1114.

Figure 14:
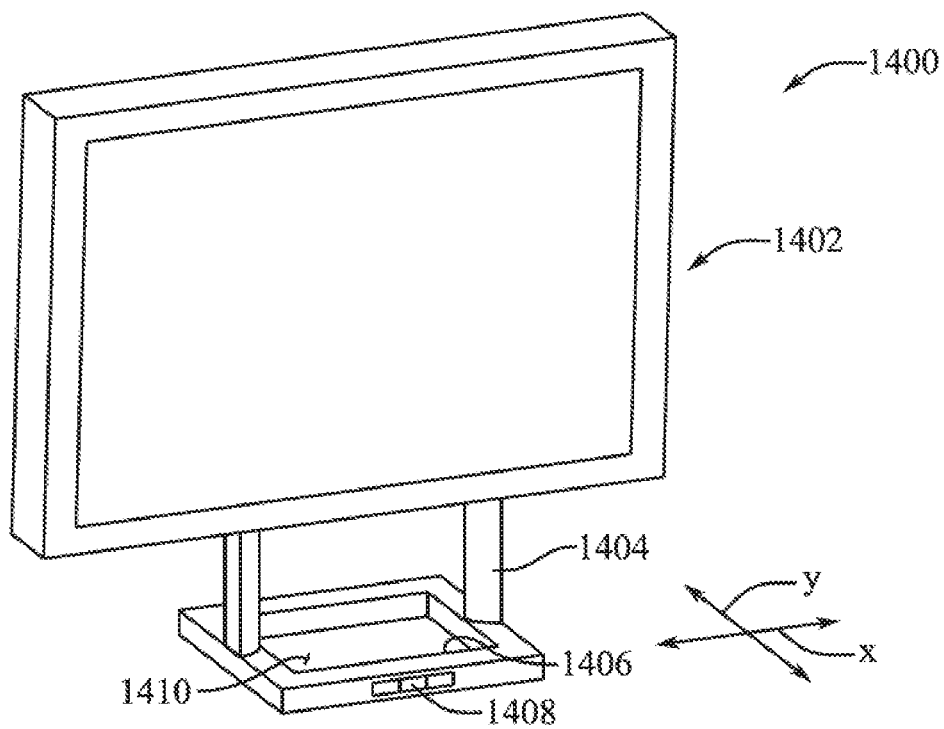
FIG. 14 shows a front isometric view of a computer system.
Figure 15:
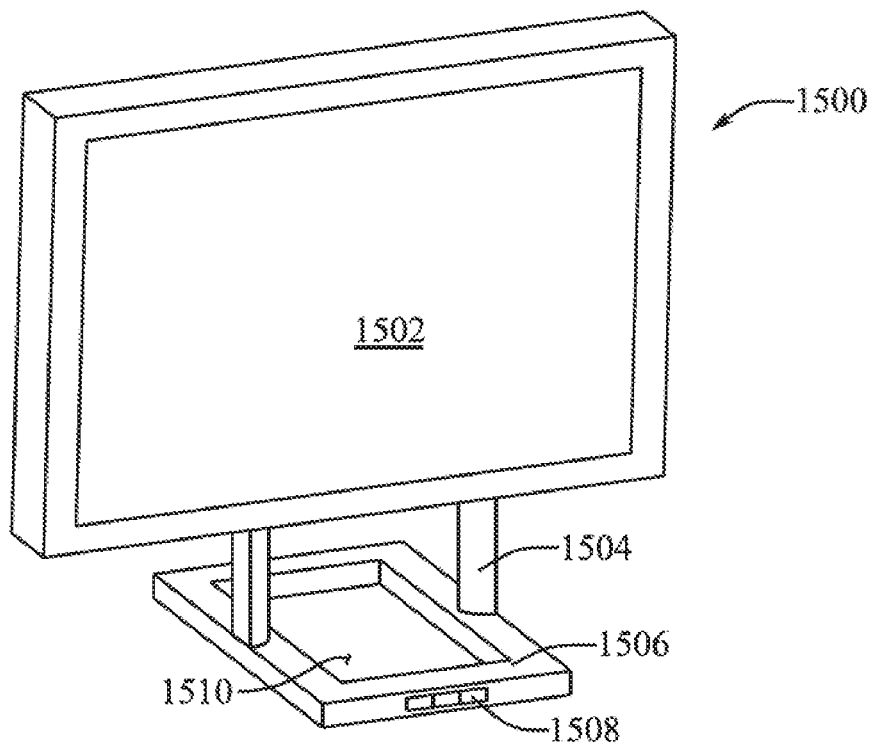
FIG. 15 shows a front isometric view of a computer system.

FIGS. 14 and 15 show embodiments of additional computing systems 1400, 1500. In FIG. 14, a computing device 1402 is supported by a stand 1404. The stand 1404 can comprise a pair of vertical supports connected to a base portion 1406. The base portion 1406 can comprise electrical contacts 1408 configured to electrically connect the stand 1404 to an external device such as, for example, a keyboard, a mouse, a smartphone, or other device. The electrical contacts 1408 can be electrically connected to a power source (not shown) or to the computing device 1402. Thus, an input device or other external device can connect to the computing device 1402 or a power source by being pressed against or otherwise engaging the electrical contacts 1408 that face the front of the system 1400 where the user is typically positioned.

The stand 1404 and base portion 1406 can comprise an internal space 1410 configured to receive a device. The internal space 1410 can have a size and shape configured to receive the same external device connectable to the electrical contacts 1408 or a second device. In some embodiments, the internal space 1410 can be configured to retain a wireless charging pad or a smartphone. The internal space 1410 can have a greater width dimension (i.e., along the X-axis of FIG. 14) than its length dimension (i.e., along the Y-axis). In this manner, the internal space 1410 can more easily accommodate a device such as a touchscreen device in a landscape orientation, a smart watch with a band extending along the Y-axis, a keypad having more columns than rows, or other similarly oriented devices. System 1500 is similar to system 1400 but comprises an internal space 1510 with a width dimension smaller than its length dimension. Accordingly, internal space 1510 can accommodate a touchscreen device configured to be in a portrait orientation, a smart watch with a band extending along the X-axis, a keypad having more rows than columns, or other similarly oriented devices. The base portion 1406, 1506 can be configured to cover the width of a stability cone extending downward from the center of mass of its respective system 1400, 1500. In other words, the base portion 1406/1506 can provide stability to the system 1400/1500 sufficient to prevent it from tipping over under normal usage conditions.

Figure 16:
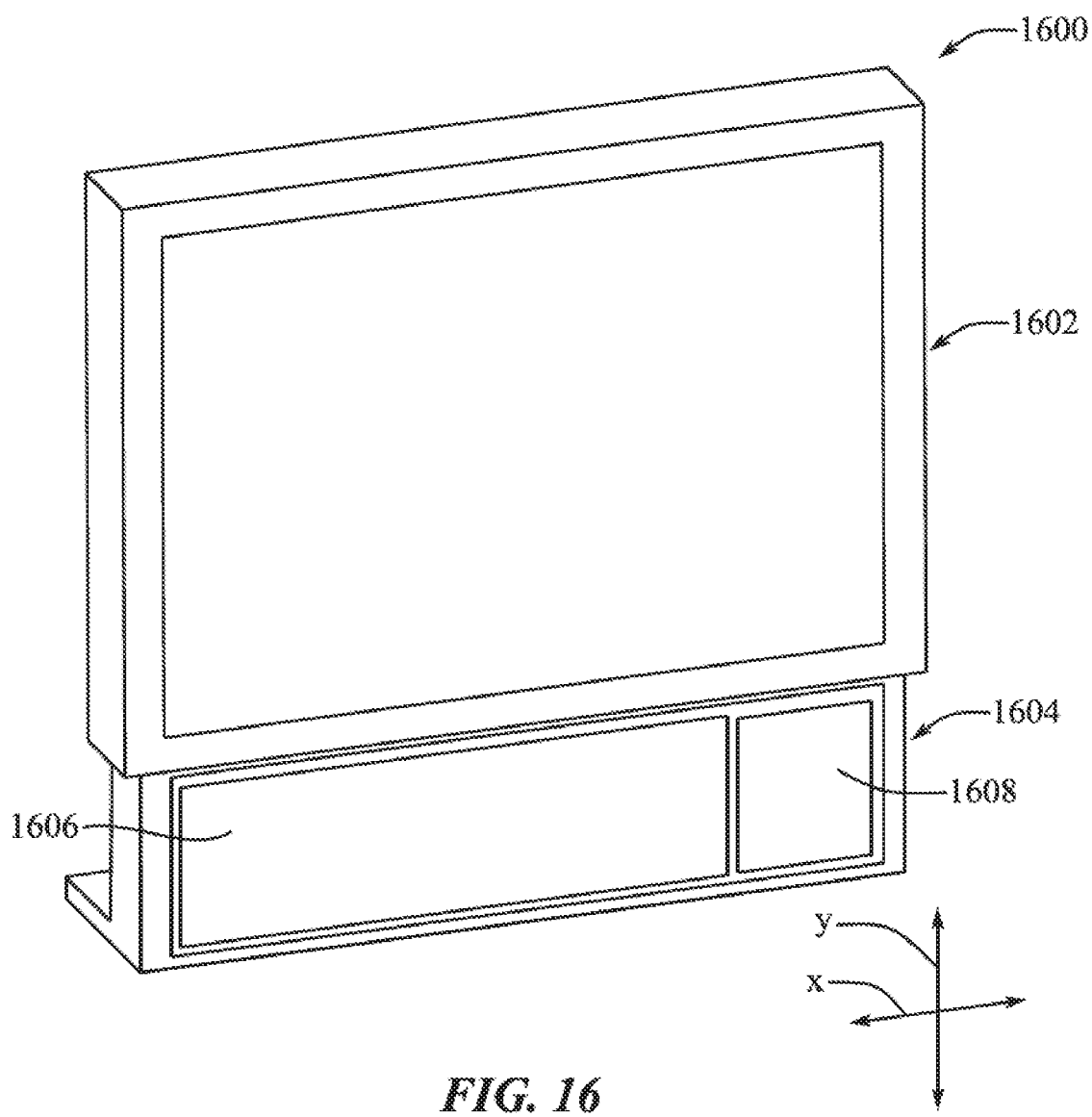
FIG. 16 shows a front isometric view of a computer system.

FIG. 16 shows a computer system 1600 in which the computing device 1602 has a stand 1604 defining a vertically-oriented internal space 1606. The internal space 1606 can have a width dimension (along the X-axis in FIG. 16) and a height dimension (along the Z-axis) substantially equal to X- and Z-dimensions of an input device 1608 or other external device. The internal space 1606 can therefore be a storage area for an accessory of the computer system 1600. An input device 1608 can have an input surface that faces the user or faces in a forward direction while in its stowed configuration (e.g., while supported in the internal space 1606). The stand 1604 can have a width dimension extending across substantially the entire width dimension of the computing device 1602. The internal space 1606 can have a width dimension smaller than, but similar to, the width dimension of the stand 1604.

Figure 17:
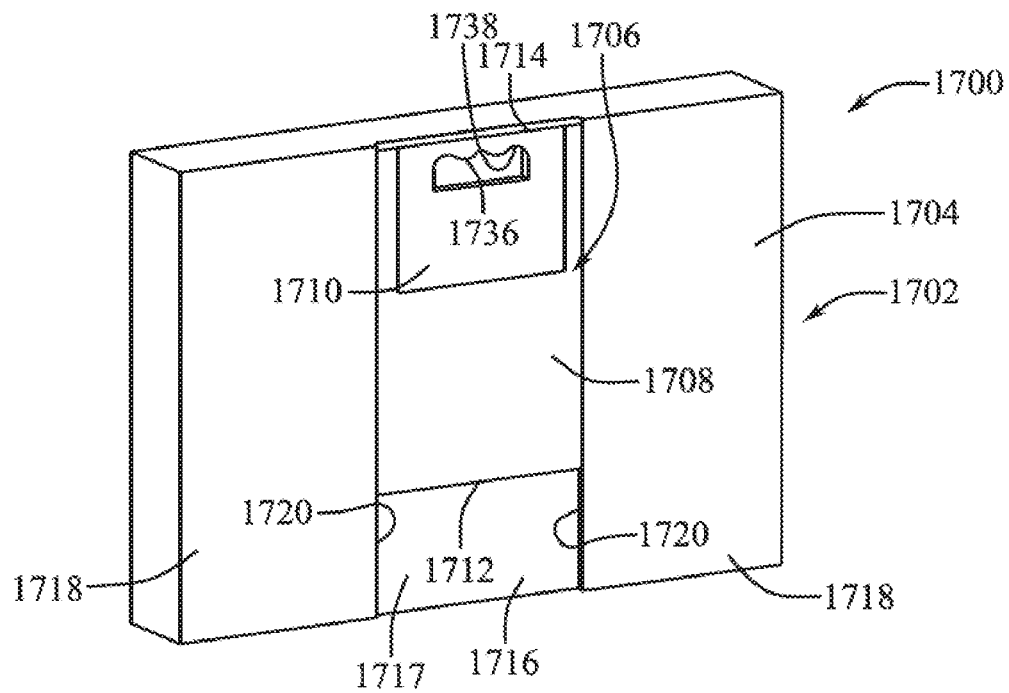
FIG. 17 shows a rear isometric view of a computer system in a collapsed configuration.

FIGS. 17-21 illustrate another embodiment of a computing system 1700. In this case, the system 1700 can have reduced packing, storage, and moving thickness as compared to conventional systems. FIG. 17 is a rear isometric view of a computing device 1702 having a housing 1704 connected to, or integrated with, a movable stand 1706. The movable stand 1706 can comprise a first segment 1708 and a second segment 1710 that are movably connected to the housing 1704 and to each other. A first hinge assembly 1712 pivotally joins the first segment 1708 to the housing 1704, and a second hinge assembly 1714 pivotally joins the first segment 1708 to the second segment 1710. The first and second hinge assemblies 1712, 1714 can comprise clutch assemblies, friction assemblies (e.g., friction disks or bushings), and related components to control and hold the first and second segments 1708, 1710 at different orientations relative to each other and relative to the housing 1704 while also allowing the first and second segments 1708, 1710 to be slidably rotatable and movable relative to each other and relative to the housing 1704 upon application of a sufficient moment at the hinge assemblies 1712, 1714 to overcome the resistance of the friction or clutch assembly.

The housing 1704 can comprise a rear recess 1716 positioned between two adjacent rear surfaces 1718. The movable stand 1706 can be at least partially positioned in the recess 1716 in the stored/collapsed/stowed position shown in FIG. 17. Thus, the entire thickness of the collapsed movable stand 1706 can lie within the overall thickness of the housing 1704 and within the depth of the recess 1716. In some embodiments, the movable stand 1706 can at least partially protrude from the recess 1716 to extend partially further rearward than the rear surfaces 1718. The recess 1716 can also be an area in which cables and accessories can be positioned (e.g., stored). With the movable stand 1706 in a storage/collapsed position, the recess 1716 can have an empty portion at surface 1717 (i.e., a storage portion of the recess 1716) between its sidewalls 1720 in which a cord or accessory can be held. This empty portion at surface 1717 can be beneficial when packing and storing the system 1700 within restrictive, thin dimensional constraints such as in product packaging and shipping containers since it can hold components that would otherwise increase the overall required volume of a storage container for the system 1700.

Figure 18:
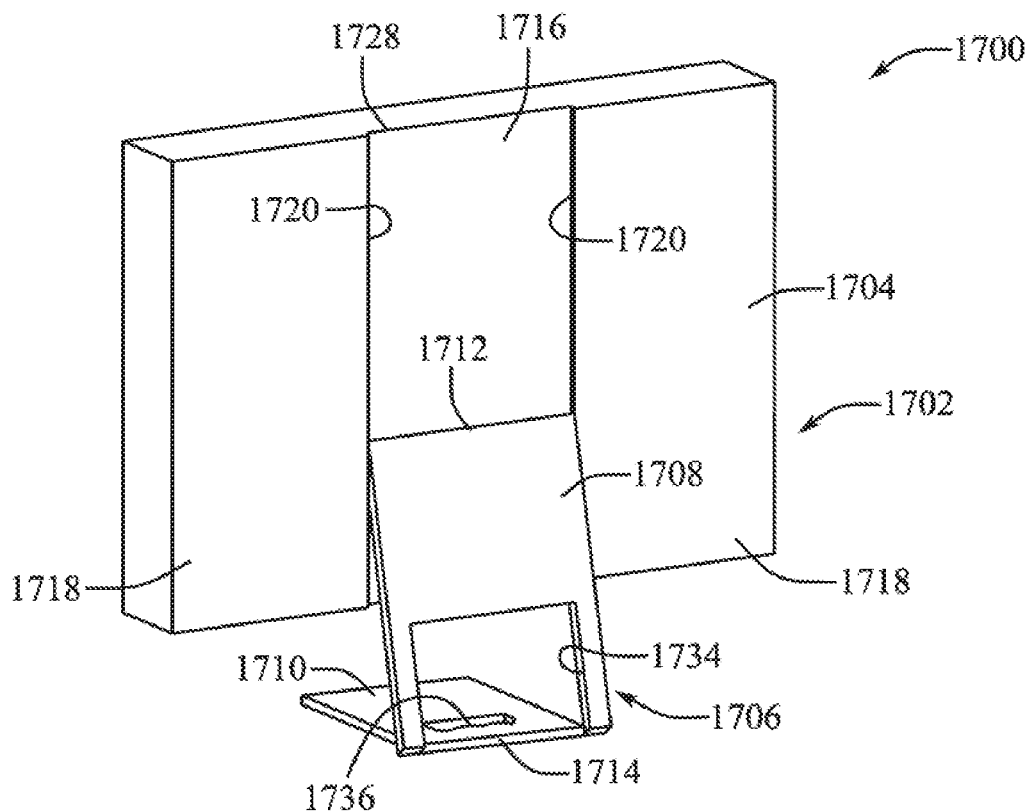
FIG. 18 shows a rear isometric view of the computer system of FIG. 17 in a deployed configuration.
Figure 19:
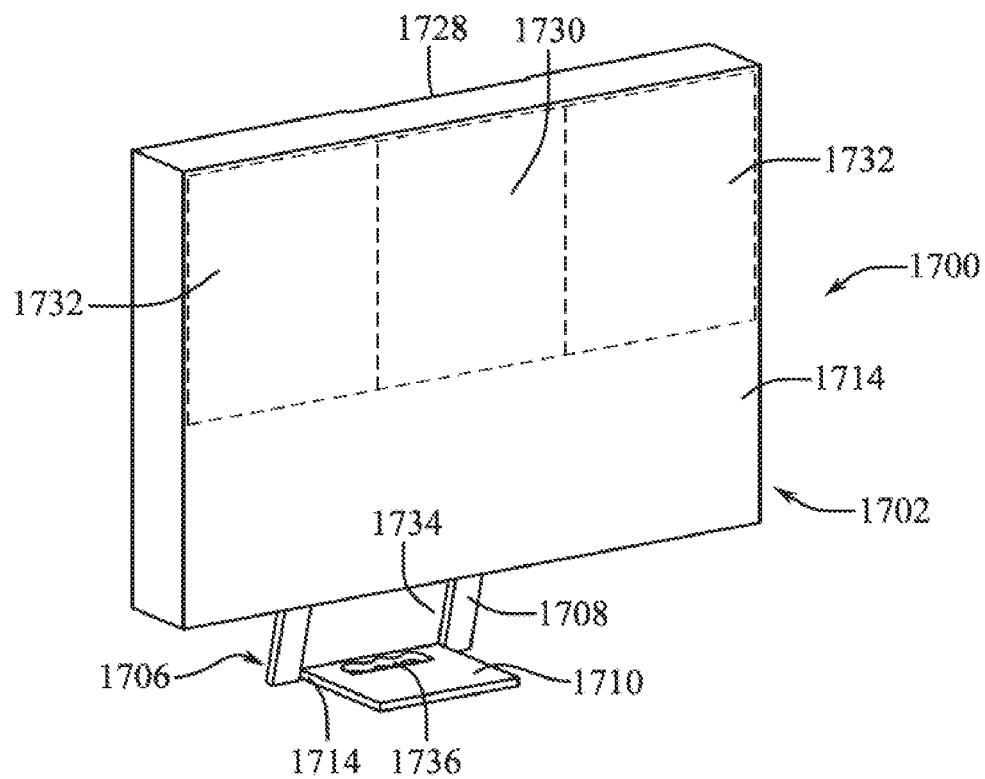
FIG. 19 shows a front isometric view of the computer system of FIG. 18.
Figure 20:
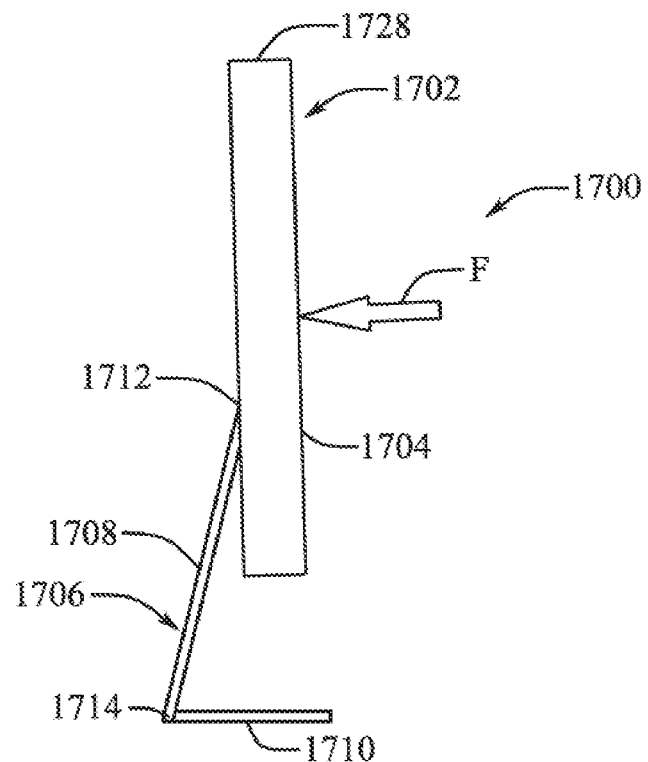
FIG. 20 shows a side view of the computer system of FIG. 18.
Figure 21:
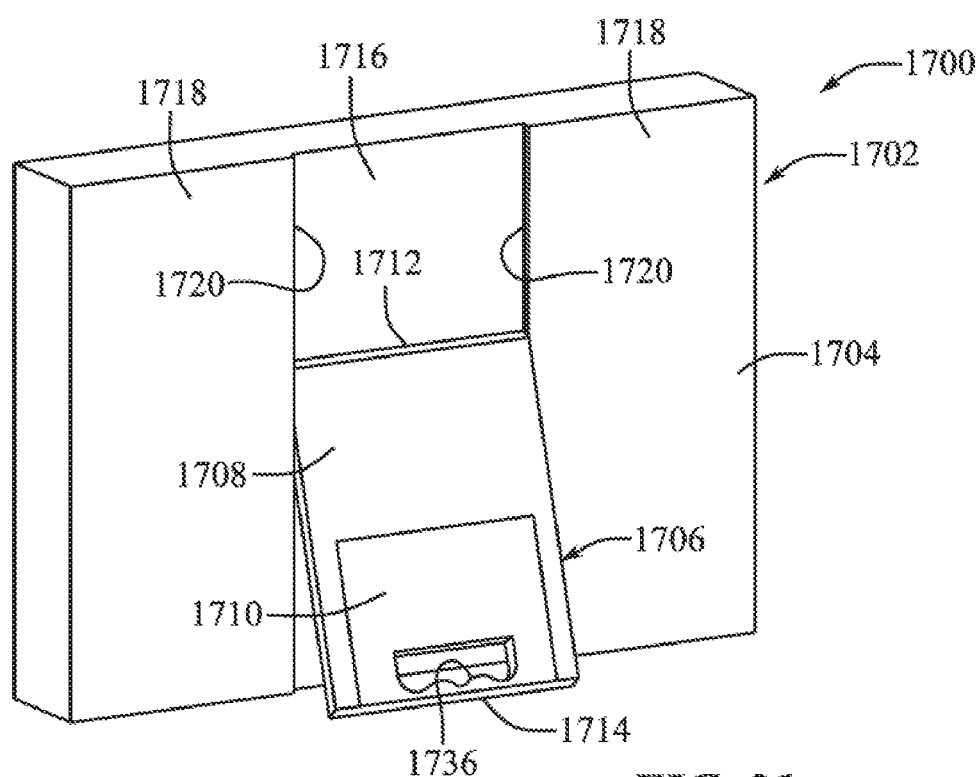
FIG. 21 shows a rear isometric view of the computer system of FIG. 17 in an alternate deployed configuration.

The first hinge assembly 1712 can extend through the first segment 1708 and into sidewalls 1720 of the recess 1716. Thus, the entire movable stand 1706 (including the first and second segments 1708, 1710) can pivot as a single unit relative to the housing 1704 about the first hinge assembly 1712. The segments 1708, 1710 can rotate to a position shown in FIG. 18-20 or 21, wherein the first segment 1708 is positioned at an angle relative to the recess 1716 and the rear surface of the housing 1704. FIG. 18 shows a rear isometric view of the system 1700 with the movable stand 1706 in a standing and deployed position wherein the stand 1706 raises the housing 1704 of the computing device 1702 above and spaced away from a support surface. FIG. 19 shows a front isometric view, and FIG. 20 shows a side view of the configuration of FIG. 18. FIG. 21 shows an alternate configuration wherein the movable stand 1706 is in a kickstand support mode or leaning support mode, as explained in further detail below.

In some embodiments, the first hinge assembly 1712 has its vertical position on the housing 1704 fixed in place. In some embodiments, the first hinge assembly 1712 can be vertically slidable along the height of the housing 1704. For example, the first hinge assembly 1712 can be mounted in channels, grooves, or slidable bearing assemblies in the sidewalls 1720 of the recess 1716. In this manner, the housing 1704 can be vertically adjustable by adjusting the position of connection between the first hinge assembly 1712 and the housing 1704.

The first segment 1708 can be rotated about the first hinge assembly 1712 across about 180 degrees between the position shown in FIG. 17 (i.e., a zero-rotation position) and a maximum rotation position wherein the first segment 1708 vertically extends below the housing 1704 and is in contact with the recess 1716 at surface 1717 between the sidewalls 1720. In this case, the depth of the housing 1704 and first segment 1708 can be minimized, and the second segment 1710 can minimize forward-moving tilting of the housing 1704 (i.e., tilting of the front of the computing device 1702 toward the user).

In some embodiments, the rotation of the first segment 1708 is limited to about 150 degrees away from the position of FIG. 17, as shown in FIG. 20. In this way, the movable stand 1706 can be configured with the second segment 1710 extending partially to the front of the housing 1704 and partially to the rear of the housing 1704, thereby providing stability against forward-moving and backward-moving tilting of the system 1700. The movable stand 1706 can therefore have a base portion (i.e., segment 1710) covering the width of a stability cone extending downward from the center of mass of the system 1700.

Figure 22:
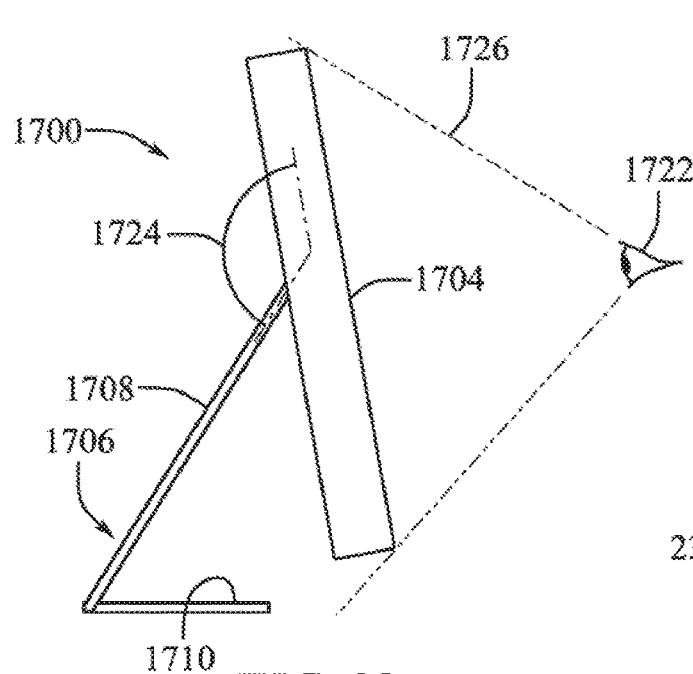
FIG. 22 shows a side view of a computer system in a deployed configuration.

In another embodiment, the rotation of the first segment 1708 can be limited to about 135 degrees away from the position of FIG. 17, as shown by angle 1724 in FIG. 22. Here, the movable stand 1706 can be sized and oriented relative to the housing 1704 in a manner limiting its visibility to a user. A user 1722 can have a field of vision 1726 from a normal viewing position (e.g., a position where a person of average height is seated and facing the display of the computing device 1702 from a normal distance and normal posture). The movable stand 1706 can have an angle of deployment 1724, a length of the first segment 1708, and a length of the second segment 1710 selected to provide support for the housing 1704 while also remaining blocked by the housing 1704 within the field of vision 1726 from the normal viewing position. Accordingly, the housing 1704 can appear to the user to float or hover above a support surface from the normal viewing position, thereby contributing to a workspace with a clean and minimal appearance to the user. In some embodiments, the weight of the movable stand 1706 can be designed to provide counterbalance to the weight of the housing 1704 in order to maintain stability in the configuration of FIG. 22.

Figure 20A:
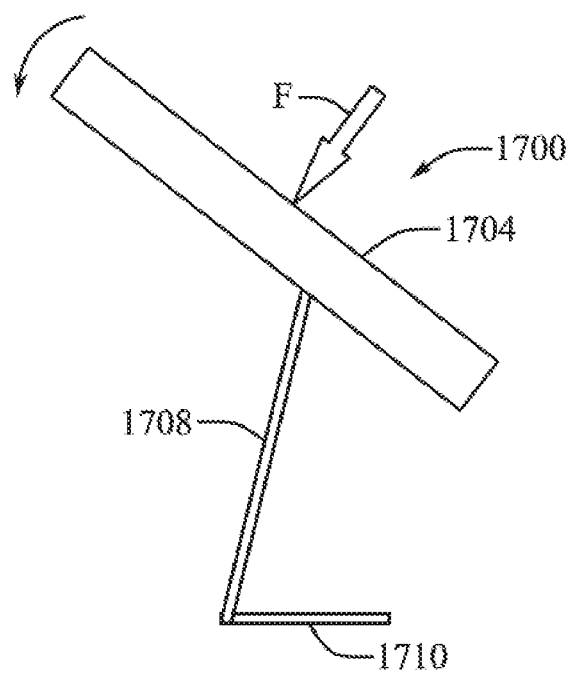
FIG. 20A shows a side view of the computer system of FIG. 18 in a different configuration.
Figure 20B:
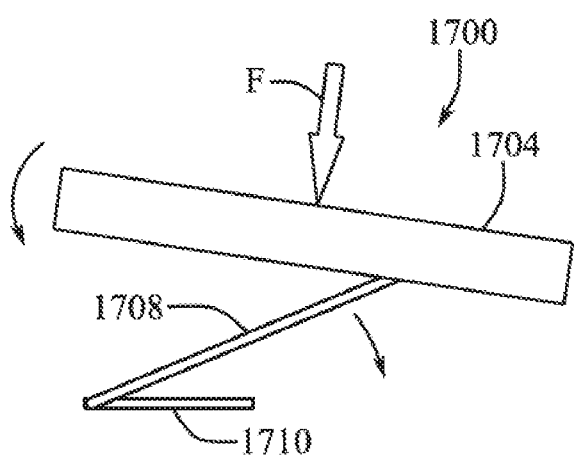
FIG. 20B shows a side view of the computer system of FIG. 18 in a different configuration.

The first and second hinge assemblies 1712, 1714 can be made with movement resistance features (e.g., friction and dampening), wherein pressing against a front surface of the housing 1704 can urge the hinge assemblies 1712, 1714 from the stand position (see FIG. 20) into the stored or collapsed position (see FIG. 17). For instance, application of a force F perpendicular to the front of the housing 1704 and positioned above the first hinge assembly 1712, as shown in FIG. 20, can rotate the housing 1704 about the first hinge assembly 1712, thereby causing relative rotation of the first segment 1708 relative to the housing 1704. See FIG. 20A. As the force F is continually applied perpendicular to the rotating housing 1704, the first and second segments 1708, 1710 can also be rotated relative to each other (see FIG. 20B) until they are moved to the position of FIG. 17 on the rear side of the housing 1704 with the housing 1704 laying down flat and with the rear side surfaces 1718 facing downward toward the support surface. Accordingly, the movable stand 1706 can be collapsed from a standing position (FIG. 20) by application of a force F to a single point on the front of the housing 1704 positioned between the vertical positions of the first hinge assembly 1712 and the top edge 1728 of the recess 1716 (i.e., within region 1730 of FIG. 19). In some embodiments, the force can be applied to a point within front top corner regions 1732 as well. Thus, the system 1700 can be transitioned from an upright, standing position to a flattened, stowed storage position by application of a single force that follows the front surface of the housing 1704 as it moves.

The second segment 1710 can be movable between a first position flattened against the recess 1716 and parallel to the rear surface of the housing 1704 (FIG. 17) and a second position substantially perpendicular to a plane that is coplanar with the rear surface 1718 of the housing 1704 (FIG. 20). In the flattened configuration, the second segment 1710 can be stored and nested within an opening 1734 in the first segment 178. The opening 1734 can have a size and shape that follows the outer perimeter of the second segment 1710 when in the flattened configuration. In some embodiments, the second segment 1710 can comprise an opening in which the first segment 1708 at least partially extends when in a flattened configuration. The opening 1734 can be used to route cables from the back of the computing device 1702 to the rear of the movable stand 1706.

The second segment 1710 can also comprise a grip opening 1736. The grip opening 1736 can comprise a horizontally-elongated shape sized to receive four side-by-side fingers of a hand of a user that extends into the opening 1736 and presses toward an inner surface 1738 thereof. See FIG. 17. The grip opening 1736 can be positioned near an edge of the housing 1704, such as the top edge 1728, so that the grip opening 1736 can be easily gripped by a user when lifting the housing 1704. With a grip opening 1736 near an edge (e.g., 1728), the user's thumb can also extend into contact with the top surface of the housing 1704 or around the front of the housing 1704 into contact with a front surface of the computing device 1702. The grip opening 1736 can beneficially be near the edge 1728 when the movable stand 1706 is in the stored or collapsed position of FIG. 17 so that the system 1700 can be lifted up at the grip opening 1736 similar to a suitcase or briefcase. When the system 1700 is in a propped or kickstand configuration, as shown in FIG. 21, the grip opening 1736 can be gripped to pull the first segment 1708 and second segment 1710 away from the recess 1716 at an angle relative to the housing 1704. With the grip opening 1736 positioned near an edge of the computing device 1702, the grip opening 1736 can also more easily be accessed when the system 1700 is stored in a box that covers the front, back, bottom, and lateral sides of the computing device 1702. Thus, the grip opening 1736 can ease and improve a user's experience when unboxing the system 1700 by making it easier to remove the system 1700 from the box.

FIG. 21 shows the system 1700 propped by the first segment 1708 and without the second segment 1710 being deployed relative to the first segment 1708. Thus, the movable stand 1706 and the housing 1704 can form an inverted lowercase "y" on the support surface. This configuration can be referred to as a kickstand or propped support configuration. This configuration can be beneficial for touchscreen computing devices 1702 or for input using a stylus or other similar user instrument. In one embodiment, the housing 1704 is upside down in FIG. 21, wherein edge 1728 is adjacent to or touching the support surface. Thus, the first hinge assembly 1712 is shown rotated between the configuration shown in FIG. 17 and the configuration of FIG. 21, and the housing 1704 is inverted (i.e., turned 180 degrees upside down). In another embodiment, the first hinge assembly 1712 is rotated from the position of FIG. 17 to the position of FIG. 21 and it is also translated along the recess 1716 between those positions (e.g., via a slidable connection to sidewalls 1720, as explained above). Thus, in this embodiment, the housing 1704 is not inverted to reach the position of FIG. 21.

Figure 23:
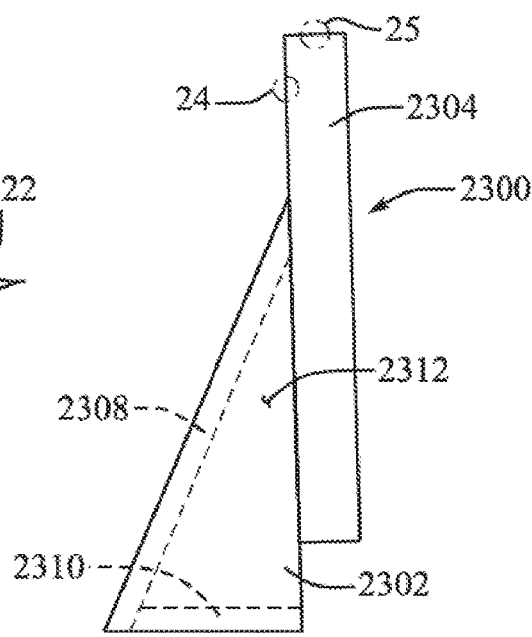
FIG. 23 shoes a side view of a computer system.

FIG. 23 shows a side view of an alternative embodiment wherein the computing system 2300 comprises a housing 2304 and a stand with a first segment 2308 and second segment 2310 covered by a flexible material 2302. The flexible material can be a sheet of a textile or similar woven structure, a rubber sheet (or a sheet of another rubber-like elastic plastic material), a similar material, or combinations thereof. The flexible material can stretch across segments 2308, 2310 to cover an internal space 2312 between the segments and the housing 2304. In this manner, the segments 2308, 2310 can have the appearance of a single piece. The flexible material 2302 can, however, change its dimensions as the segments 2308, 2310 move relative to each other. As the segments move, the flexible material 2302 can remain taut in a stretched condition in a manner that minimizes wrinkles or folds in the material. The internal space 2312 can also be used to house or store components for the system 2300 such as input devices, a power supply, cords, accessories, similar components, and combinations thereof.

Figure 24:
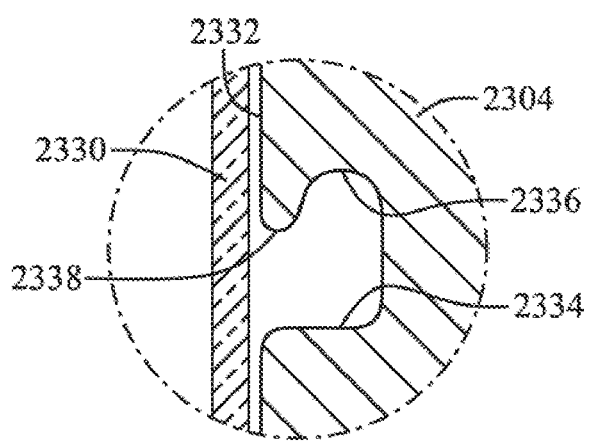
FIG. 24 shows a side section view of a grip portion of the computer system of FIG. 23.
Figure 25:
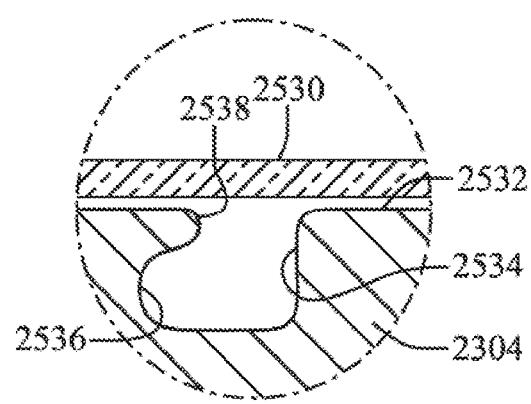
FIG. 25 shows a side section view of a grip portion of the computer system of FIG. 23.

FIGS. 24 and 25 illustrate side section views taken centrally through the housing 2304 at hidden grip detail areas 24 and 25 shown in FIG. 23. As shown in FIG. 24, the housing 2304 can have a rear surface 2332 covered by a flexible material 2330. The rear surface 2332 can comprise a recess 2334 having a grip contact surface 2336. A hand of a user can be inserted into the recess 2334 by deforming (e.g., stretching, bending, or folding) the elastomeric flexible material 2330, and finger tips or inner finger pads can grip the housing 2304 by pulling the flexible material 2330 between the finger tips and the grip contact surface 2336. The grip contact surface 2336 can have an end protrusion 2338 designed to help prevent the fingertips from slipping out of the recess 2334 while pressing upward toward the grip contact surface 2336.

With a hand in the recess 2334, the housing 2304 can be more easily moved by the user. Removing the hand from the recess 2334 can allow the flexible material 2330 to straighten and elastically return to the position shown in FIG. 24, thereby hiding the external appearance of the recess 2334. In the embodiment of FIG. 25, the recess 2534 is formed in a top surface 2532 of the housing 2304, there is a top-covering flexible layer 2530, and the grip contact surface 2536 and protrusion 2538 are configured to hold fingertips that hook underneath and are supported only by the protrusion 2538 instead of being supported by a protrusion (i.e., 2338) and contact surface (i.e., 2336). Thus, the housing 2304 can be carried from the top thereof instead of from the back side. A similar configuration can be provided in a lateral side or bottom surface of the housing 2304 as well.

Figure 26:
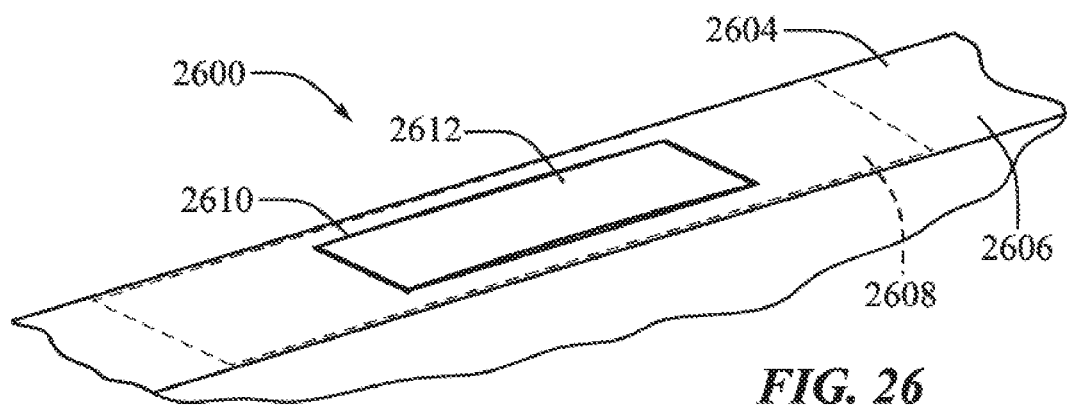
FIG. 26 shows an isometric view of a handle apparatus for a computer system with the handle in a retracted configuration.
Figure 27:
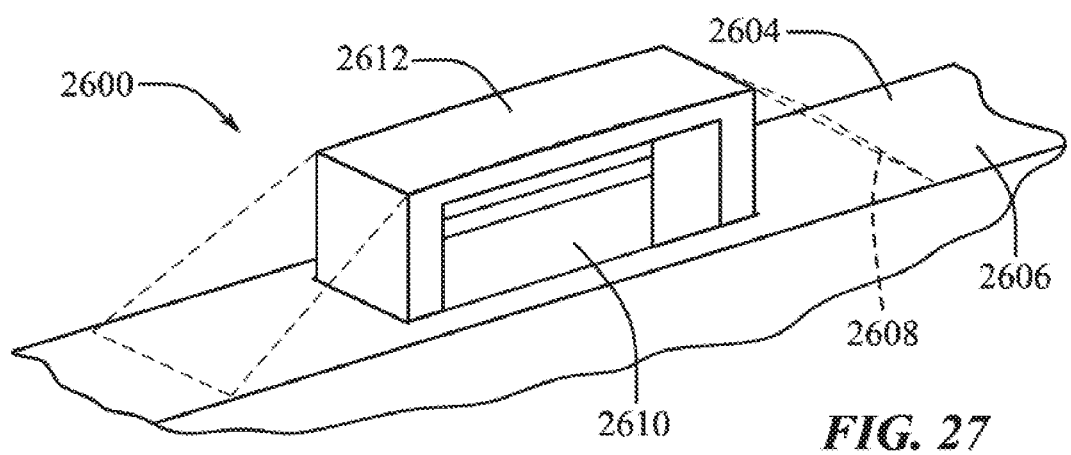
FIG. 27 shows an isometric view of a handle apparatus for a computer system with the handle in an extended configuration.

FIGS. 26-27 illustrate another grip or carrying portion of a computing system 2600. In this embodiment, the system 2600 can have a side or top surface 2606 at least partially covered by a flexible material layer 2608 (shown in broken lines). The surface 2606 can have an opening 2610 in which a retractable handle 2612 can be stored. The handle 2612 can be movable between the stored position (FIG. 26) and the extended position (FIG. 27) by pressing inward on the handle 2612 to a predetermined depth while it is in the stored position in a manner triggering a handle release mechanism in the housing and then releasing the handle 2612 to allow it to slide away from the surface 2606 to the extended position. The handle 2612 can be stowed again by pressing inward on it, thereby retracting the handle 2612 back into the opening 2610 to the position of FIG. 26 (or greater depth), thereby triggering a handle locking mechanism. Releasing pressure on the handle 2612 after triggering the locking mechanism can make the locking mechanism prevent the handle 2612 from springing back out to the position shown in FIG. 27. Thus, the handle 2612 can have push-to-release and push-to-retract configurations.

The flexible material layer 2608 can cover the handle 2612 in the retracted and expanded positions, wherein in the retracted position, the flexible material layer 2608 can cover and hide the handle 2612 to make the outer surface of the housing appear to be seamless. In the expanded position, the flexible material layer 2608 can cover the handle 2612 while still being flexible enough to permit the user to deform the layer 2608 to insert fingers into the handle 2612 to grip and carry the system 2600 by the handle 2612.

Figure 28:
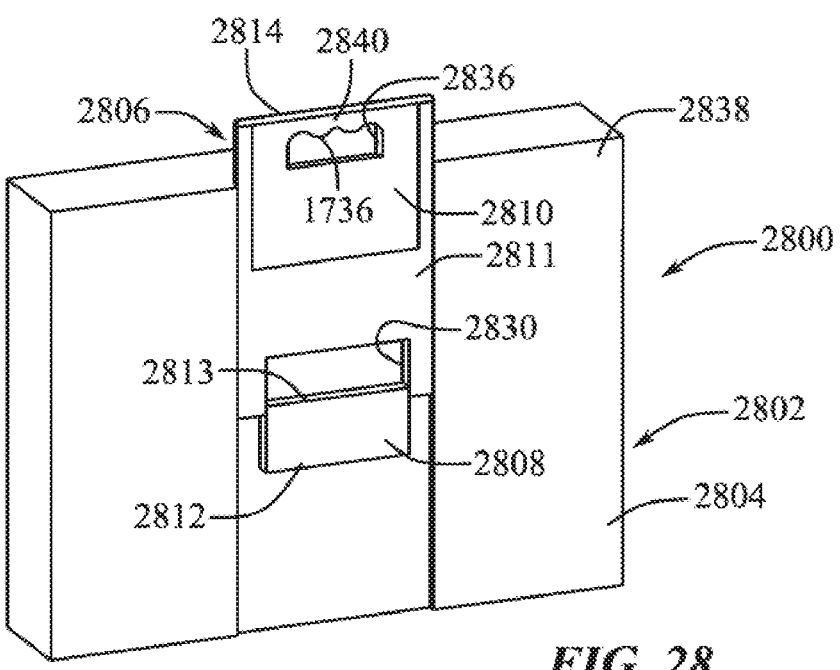
FIG. 28 shows a rear isometric view of a computer system in a collapsed configuration.

FIGS. 28-33 illustrate another embodiment of a computing system 2800. In this case, the system 2800 can have reduced packing, storage, and moving thickness as compared to conventional systems. FIG. 28 is a rear isometric view of a computing device 2802 having a housing 2804 and a movable stand 2806 in a collapsed or storage position. The movable stand 2806 can comprise a first segment 2808, a second segment 2810, and a third segment 2811. The third segment 2811 can link the first and second segments 2808, 2810 to each other. A first hinge assembly 2812 can connect the first segment 2808 to the housing 2804, a second hinge assembly 2813 can connect the first segment 2808 to the third segment 2811, and a third hinge assembly 2814 can connect the second and third segments 2810, 2811.

Figure 29:
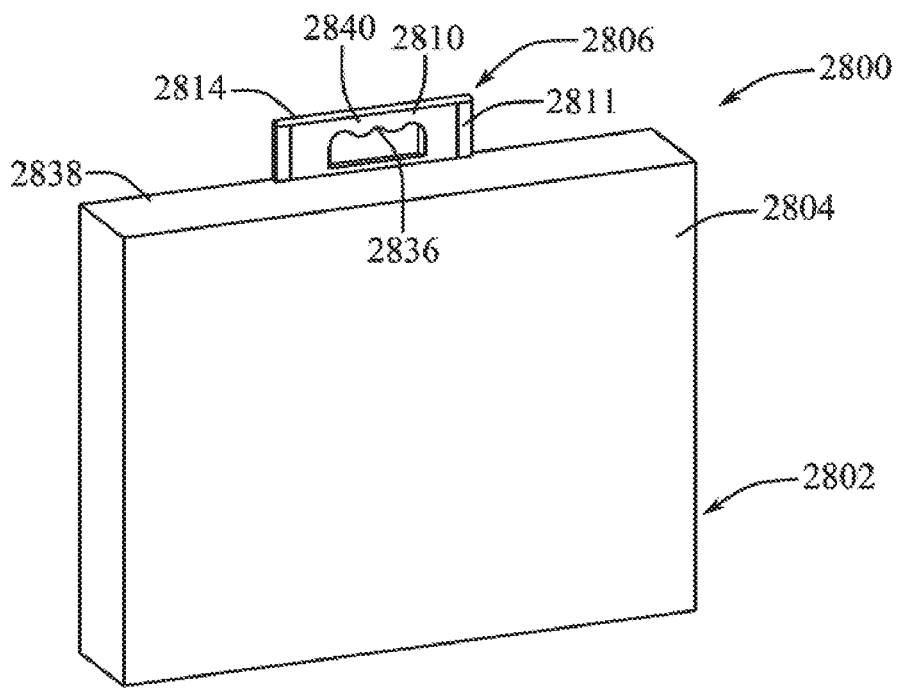
FIG. 29 shows a front isometric view of the computer system of FIG. 28.
Figure 30:
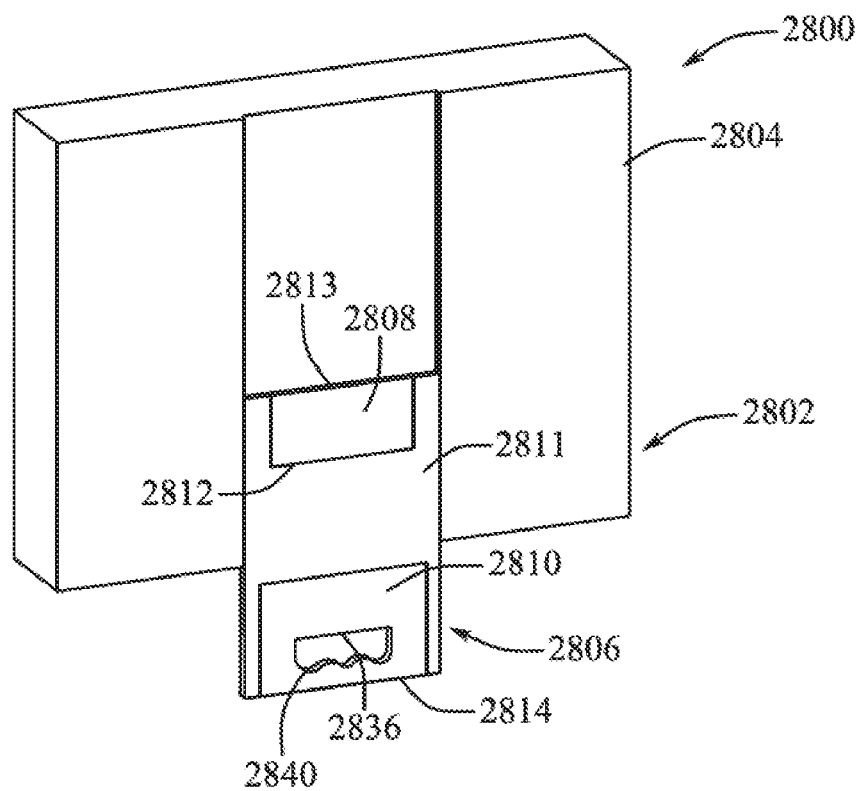
FIG. 30 shows a rear isometric view of the computer system of FIG. 28 in an alternate collapsed configuration.

FIG. 29 is a front isometric view of the system 2800 in the configuration shown in FIG. 28. FIG. 30 is a rear isometric view that shows the system 2800 in a position with the movable stand 2806 pivoted 180 degrees relative to the housing 2804 and relative to the configuration of FIG. 28. FIG. 31 shows a rear isometric view, FIG. 32 shows a front isometric view, and FIG. 33 shows a side view, all of which show the movable stand 2806 in a configuration where the second and third segments 2810, 2811 are spaced from the rear surface of the housing 2804 and are in a standing support position relative to the housing 2804.

The first segment 2808 can be rotated into and out of an opening 2830 in the third segment 2811. The second segment 2810 can be rotated into and out of an opening 2832 in the third segment 2811. The implementation of three segments 2808, 2810, 2811 can allow the rear surface 2815 of the housing 2804 to be parallel to one of the segments (e.g., 2811) when the movable stand 2806 is in the standing and fully deployed condition. Additionally, all three segments 2808, 2810, 2811 can be arranged orthogonal to each other, as shown in FIG. 33. In one embodiment, the three segments 2808, 2810, 2811 may be locked in their orthogonal positions or they may held in such positions by frictional mechanisms or clutch mechanisms.

The spacing between the rear surface 2815 and the second and third segments of the movable stand 2806 can facilitate pivoting the housing 2804 to be angled facing at an angle downward relative to the horizon or downward toward the support surface while being supported by the stand. Using three segments 2808, 2810, 2811 can also allow the second segment 2810 to be positioned further forward relative to the housing 2804 as compared to the embodiment of system 1700 because the second and third segments 2810, 2811 can pivot forward and under the housing 2804 at second hinge assembly 2813. Spacing the movable stand 2806 away from the rear surface 2815 can also help facilitate routing of cables and cords extending from the housing 2804, such as by reducing the chance that cords will be pinched between the housing 2804 and the movable stand 2806 or by providing opening 2830 to centrally gather cables through the movable stand 2806.

In the configuration of FIGS. 28-29, a handle grip opening 2836 on the second segment 2810 can extend from an edge 2838 of the housing 2804. The extension of the second segment 2810 can allow the user to grip the second segment 2810 completely through the handle grip opening 2836 and around the bar 2840 aligned with the third hinge assembly 2814. A user can therefore securely grip the movable stand 2806 at the bar 2840 using his or her four fingers (through the grip opening 2836) and thumb (wrapped around an opposite side of the bar 2840 relative to the fingers). In some embodiments, the grip opening 2836 is only elongated enough to fit only one to three fingers of a hand. The grip opening 2836 can also extend from the housing 2804 in a manner making it easier to grasp the system 2800 when removing it from a narrow storage position such as within a narrow box.

Figure 34:
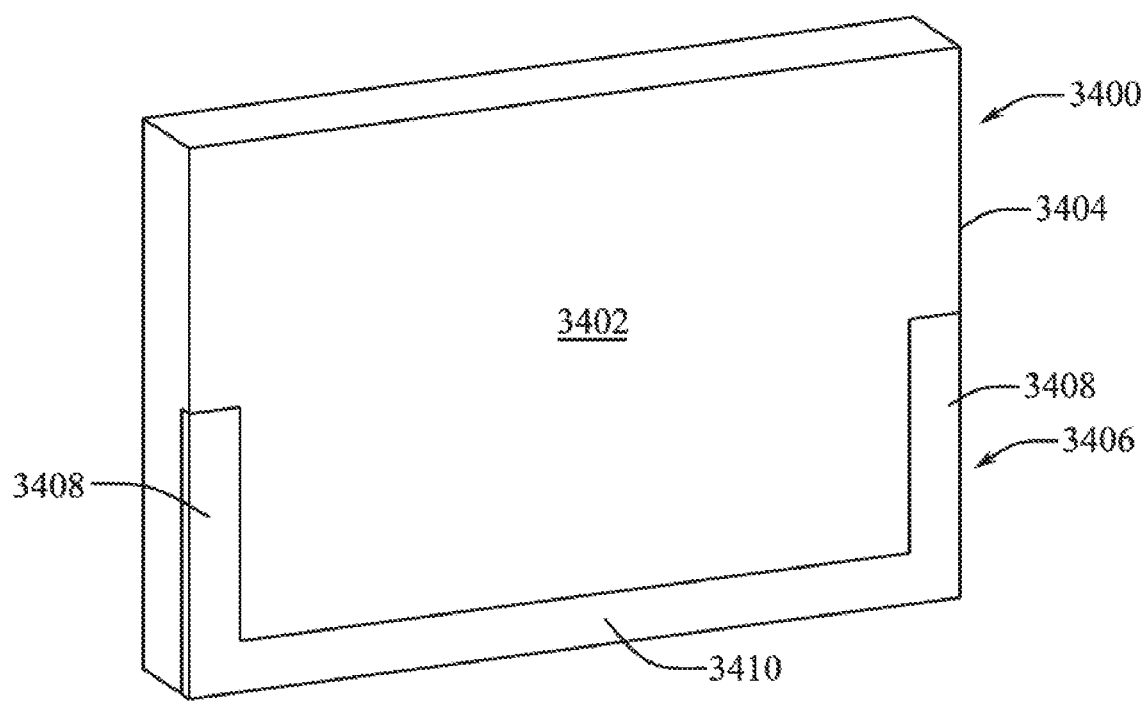
FIG. 34 shows a rear isometric view of a computer system in a collapsed configuration.
Figure 35:
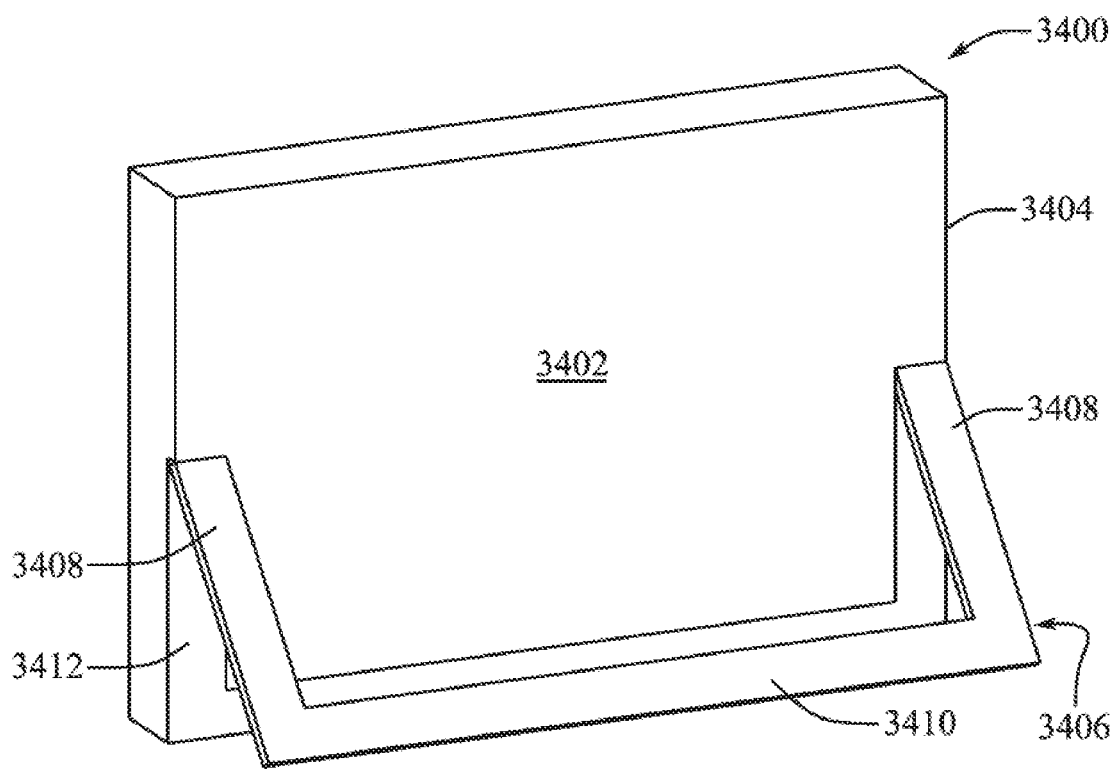
FIG. 35 shows a rear isometric view of the computer system of FIG. 34 in a first deployed configuration.
Figure 36:
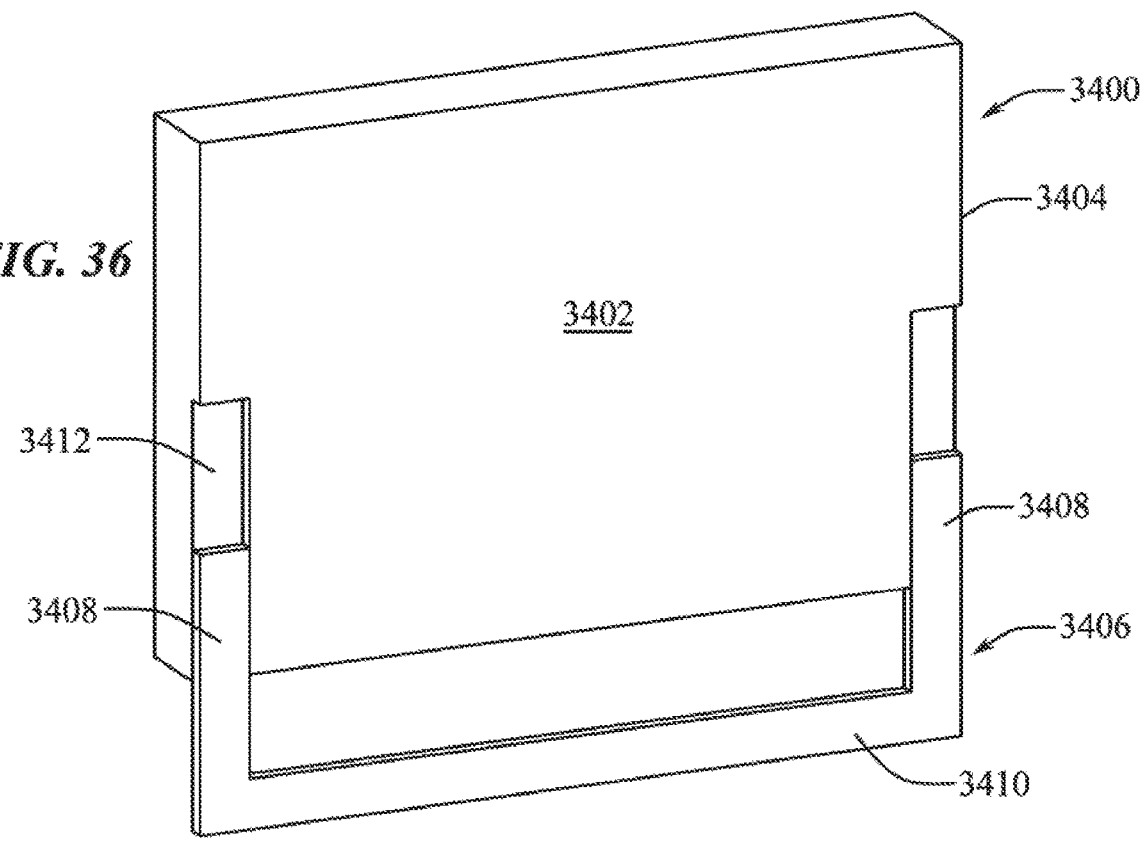
FIG. 36 shows a rear isometric view of the computer system of FIG. 34 in a second deployed configuration.

FIGS. 34-36 show another embodiment of a computing system 3400 in which the computing device 3402 has a stand 3406 partially extending around the perimeter of the housing 3404. For instance, the stand 3406 can comprise parallel portions 3408 joined to each other by a width portion 3410. The parallel portions 3408 can be pivotally joined to the housing 3404, as shown by comparing FIGS. 34 and 35. In some embodiments, the parallel portions 3408 can be slidably joined to the housing 3404, as shown by comparing FIGS. 34 and 36. The slidable connection can be provided in a manner similar to the slidable connection between first hinge assembly 1712 and sidewalls 1720. In some embodiments, the stand 3406 can be pivotally and slidably joined to the housing 3404.

In the storage configuration of FIG. 34, the stand 3406 can be seated in a perimeter recess 3412 (see FIGS. 34-36) at least partially extending around three sides of the housing 3404. Accordingly, the system 3400 can be configured in a storage configuration shown in FIG. 34 or in a deployed, standing configuration shown in FIGS. 35 and 36. Pivoting the stand 3406 can enable an upright angled orientation of the system 3400 wherein the housing 3404 is held at a substantially vertical angle similar to the kickstand or propped configurations described above. Sliding the stand 3406 can enable height adjustment of the housing 3404 relative to a support surface. Pivoting and sliding the stand 3406 can enable supporting the housing 3404 at positions and angles that would not be possible with only pivoting or sliding alone.

Additionally, sliding the stand 3406 can allow the width portion 3410 to be grasped by a user, thereby allowing the system 3400 to be carried by holding the stand 3406 as a handle extending across substantially the entire width of the housing 3404. In some embodiments, the stand 3406 can extend upward from a top surface of the housing 3404 to make the housing 3404 more easily grasped and carried. For example, the stand 3406 can be positioned on the housing 3404 in a manner inverted relative to FIG. 34, wherein the width portion 3410 extends across a top edge of the housing 3404.

Figure 37:
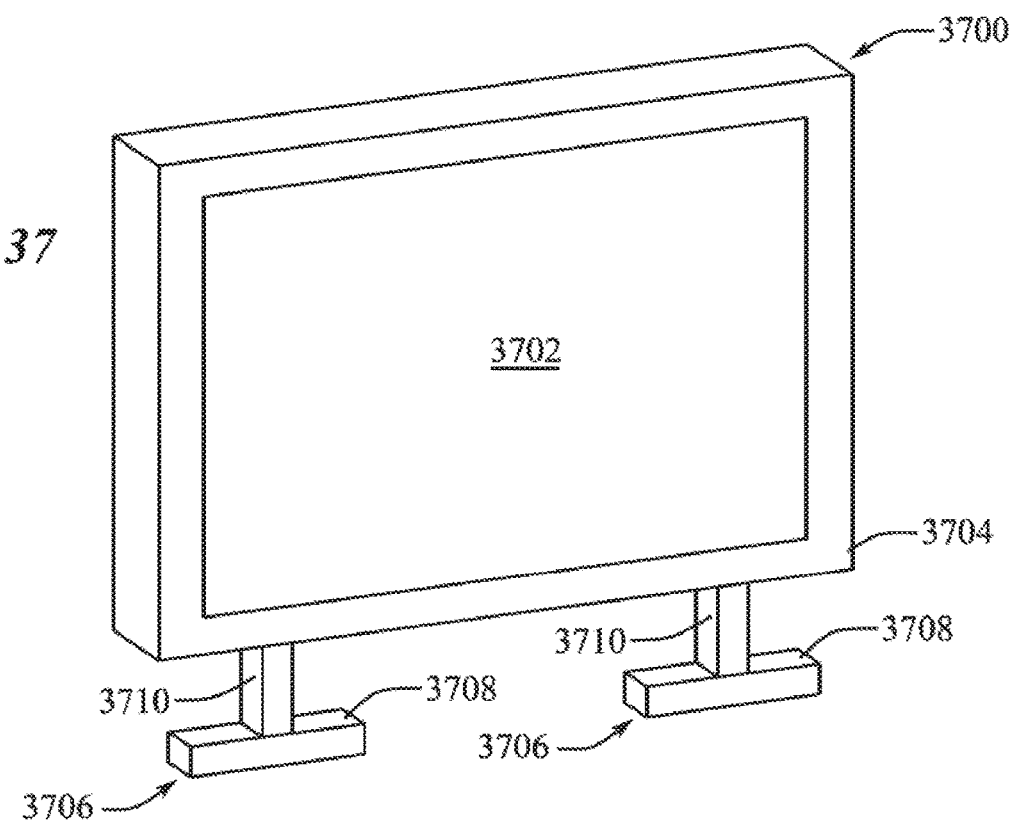
FIG. 37 shows a front isometric view of a computer system in a first configuration.
Figure 38:
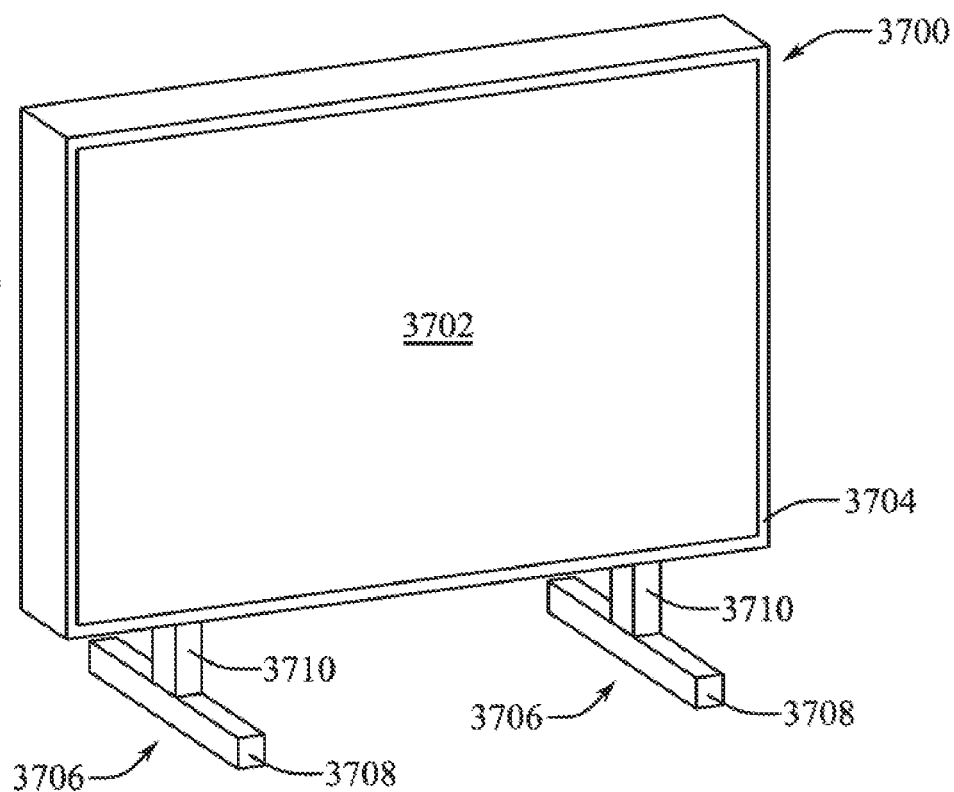
FIG. 38 shows a front isometric view the computer system of FIG. 37 in a second configuration.

FIGS. 37-38 illustrate isometric front views of a system 3700 wherein the computing device 3702 can have a housing 3704 with two rotatable stand legs 3706. The rotatable stand legs 3706 can be rotatable between a flattened configuration shown in FIG. 37, wherein the legs 3706 have base portions 3708 oriented in a plane substantially parallel with the front surface of the housing 3704 or substantially parallel with a plane extending through the extended portions 3710 of both legs 3706. Accordingly, the flattened configuration of FIG. 37 can correspond to a packed or storage configuration wherein the overall thickness of the system 3700 is about equal to the total thickness of the housing 3704 since the base portions 3708 have width and thickness dimensions less than or equal to the thickness (i.e., horizontal depth) of the housing 3704.

The legs 3706 can be repositioned to the standing or extended orientation shown in FIG. 38. In this orientation, the base portions 3708 can extend forward and backward relative to the extended portions 3710 and relative to the housing 3404. Accordingly, the base portions 3708 can stabilize the system 3700 against forward or backward tilting under normal usage conditions.

In some embodiments, the legs 3706 can be biased into at least one of the standing or extended orientations. Accordingly, the legs 3706 can require application of a moment about the extended portions 3710 to keep the legs 3706 in the orientation shown in FIG. 37. For example, the legs 3706 can be constrained in the flattened configuration by packaging (e.g., a box or packing materials) or by a releasable rotation lock or latch of the system 3700. When the constraints on the legs 3706 are removed or released, they can automatically reorient themselves in the position of FIG. 38 due to a moment applied by a spring or other biasing member. In some embodiments, the legs 3706 can also be dampened to control a smooth transition between configurations. Accordingly, the system 3700 can automatically move itself from a flattened configuration to an expanded or standing configuration by removing constraints or packaging surrounding the system 3700.

In some arrangements, the system 3700 can comprise a handle or grip (not shown) or switch (not shown) on the housing 3704 that, when pulled, grasped, or otherwise operated, can cause the legs 3706 to pivot from the standing configuration to the flattened configuration. In this manner, lifting the system 3700 by the handle can automatically reduce the width profile of the system 3700 to make the system 3700 easier to move. In some embodiments, the weight of the computing device 3402 can pull down on the handle as it is grasped by the user, so the weight of the computing device 3402 can be a sufficient force applied to the handle to cause the transition between the flattened and standing configurations. Releasing the handle (i.e., causing the weight to no longer be supported by the handle) can cause the legs 3706 to transition back to the standing configuration due to a rotational biasing member in the legs 3706 or housing 3704 acting on the extended portions 3710.

Figure 39:
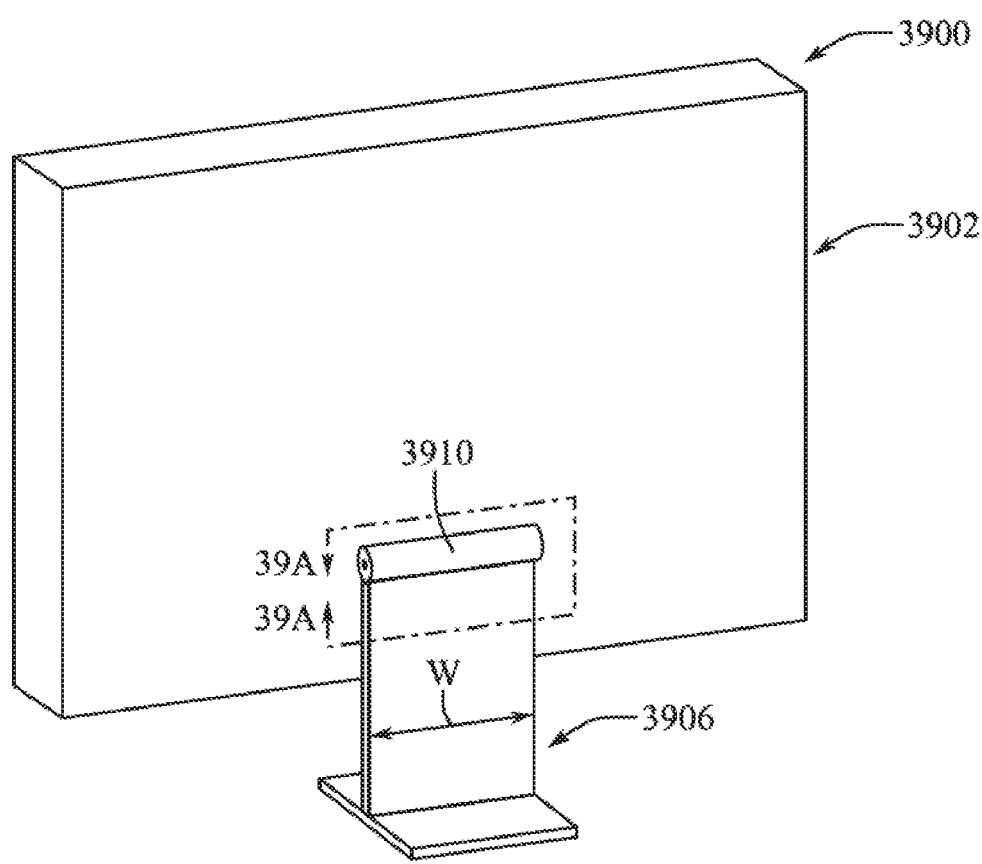
FIG. 39 shows a rear isometric view of a computer system.
Figure 39A:
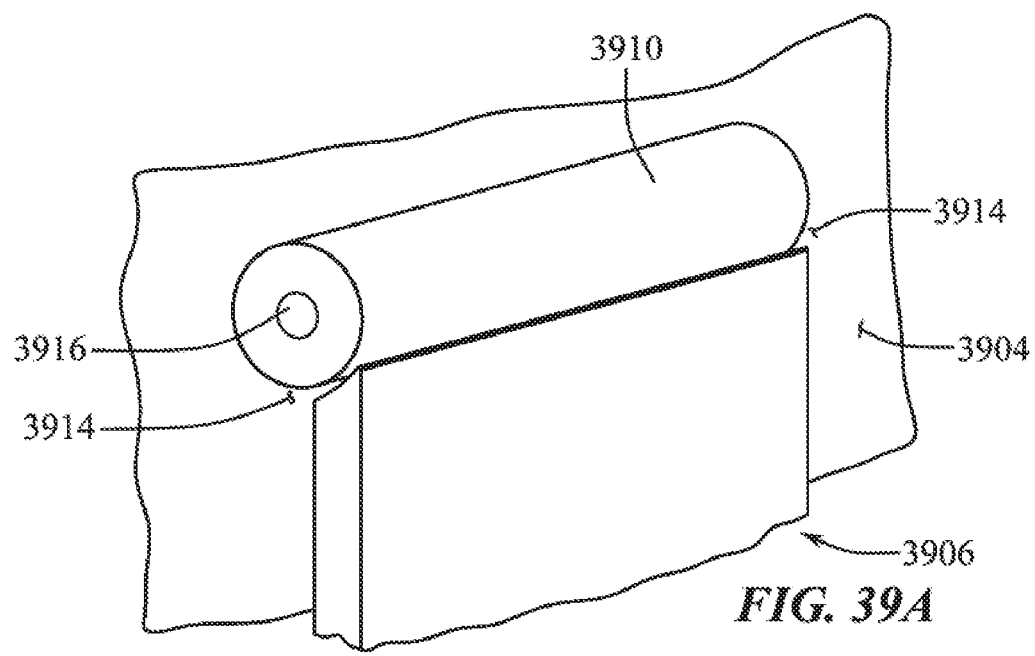
FIG. 39A shows a detail view of the computer system of FIG. 39.
Figure 40:
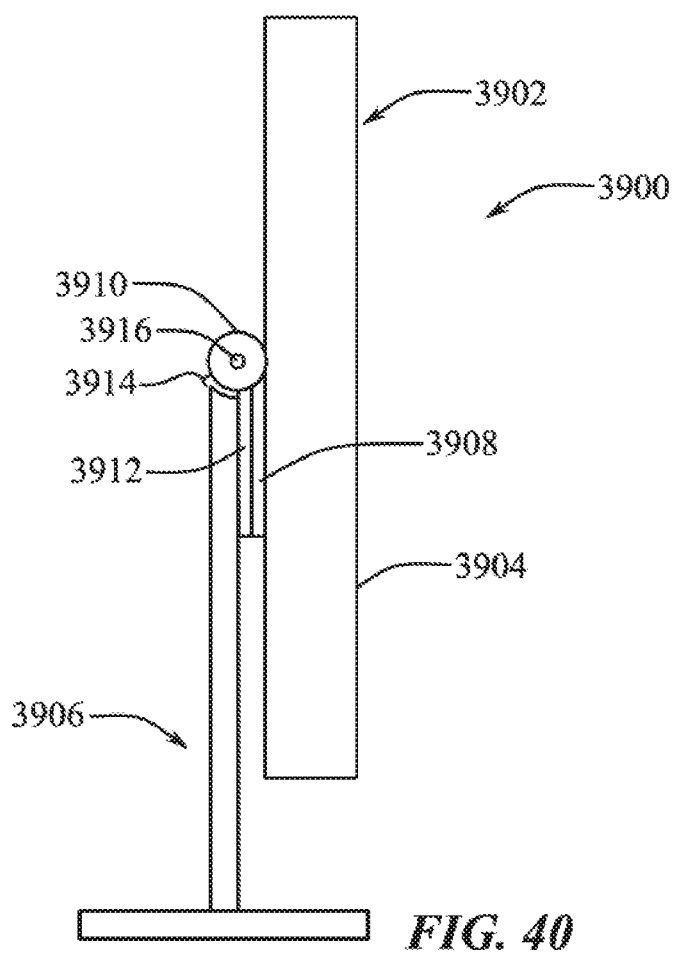
FIG. 40 shows a side view of the computer system of FIG. 39.

FIGS. 39-40 illustrate another computing system 3900. FIG. 39 is a rear isometric view of the system 3900, FIG. 39A is a detail view of FIG. 39, and FIG. 40 is a side view of the system 3900. The system 3900 can comprise a computing device 3902 with a housing 3904 mounted to a stand 3906 by way of a pivot mechanism. The stand may include multiple segments, such as a first segment extending from the computing device 3902 to a second segment which is positioned on a supporting surface. In one embodiment, the first and second segments are fixed relative to each other at a defined angle such as shown in FIGS. 39 and 40. In another embodiment, the first and second segments may be pivotally coupled to each other such as set forth with respect to other embodiments described herein. Additionally, in other embodiments, the stand may comprise more segments than two, consistent with other embodiments described herein. The housing 3904 can be mounted to a first pivot plate 3908, which is mounted to a pivot cylinder 3910. The pivot cylinder 3910 can then be mounted to a second pivot plate 3912. The second pivot plate 3912 can be mounted to the stand 3906. See FIG. 40. The pivot plates 3908, 3912 can be pivoted relative to each other about the pivot cylinder 3910.

The pivot plates 3908, 3912 can have lateral widths less than the lateral width W of the stand 3906. Accordingly, as shown in FIGS. 39 and 39A, the pivot plates 3908, 3912 can be hidden by the width of stand 3906 from many viewing angles. The pivot cylinder 3910 can, therefore, have a "floating" appearance from rear and three-quarter rear views, wherein the cylinder 3910 does not appear to be connected to the stand 3906 or to the housing 3904 due to a gap 3914 positioned between the pivot cylinder 3910 and the stand 3906. See FIGS. 39A and 40.

The stand 3906 and the pivot cylinder 3910 can house electronic components for the system 3900. For example, the pivot cylinder 3910 can house a power supply or another similar computer component that would otherwise increase the thickness of the housing 3904 if disposed therein.

Figure 41:
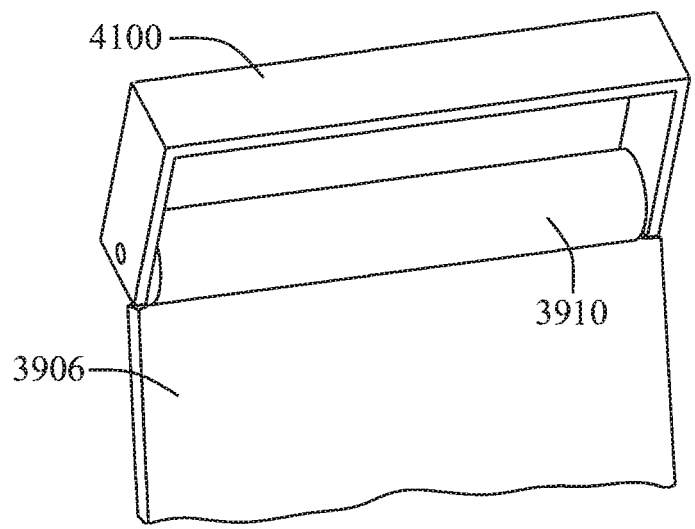
FIG. 41 shows a rear isometric view of the computer system of FIG. 39 with a handle attachment.
Figure 42:
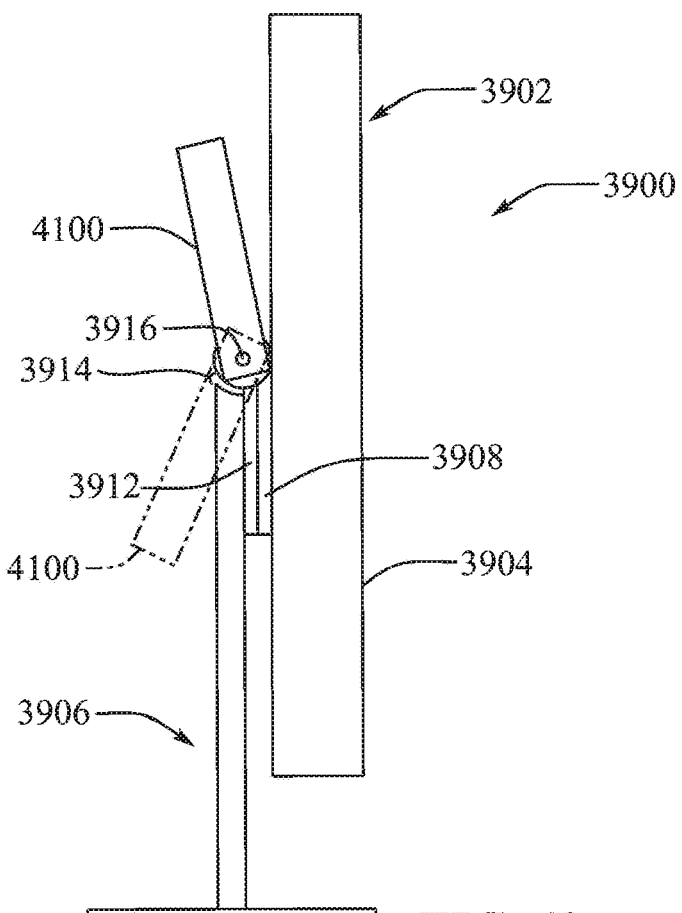
FIG. 42 shows a side view of the computer system of FIG. 39 with a handle attachment.

The pivot cylinder 3910 can also include an end recess 3916 at each of its laterally-facing ends. As shown in FIGS. 41 and 42, a handle grip 4100 can be mounted to the pivot cylinder 3910 in the end recesses 3916. The handle grip 4100 can be removably mounted to the pivot cylinder 3910, such as by a snap-in interference fit. In some embodiments, the handle grip 4100 can be mounted to the end recesses 3916 using fasteners or permanent adhesives. In some embodiments, the handle grip 4100 and the pivot cylinder 3910 can be configured to enable relative rotation between handle grip 4100 and the pivot cylinder 3910 (as indicated by dashed lines in FIG. 42). In other embodiments, the handle grip 4100 and the pivot cylinder 3910 can be configured to hold the handle grip 4100 in a specified position, or at a specified angle, relative to the pivot cylinder 3910 and the stand 3906.

The shape of the handle grip 4100 can affect the overall depth and appearance of the computing system 3900, when viewed from the side and/or the back. FIG. 42 is a side view of the computing system 3900 illustrating various profiles that can be achieved by varying the angular position of the handle grip 4100 relative to the stand 3906 and the computing device 3902. As shown, the rotationally mounting the handle grip 4100 to the end recesses 3916 of the pivot cylinder (3910 of FIG. 41) allows the handle grip to be rotated into various positions, adding flexibility in modifying the profile shape of the overall computing system 3900 and allowing the handle grip to serve various functions.

According to one example, the handle grip 4100 can be rotationally mounted to the end recess 3916 with a loose fit, allowing the handle grip to be vertical when being used to lift the overall computing system 3900, and naturally rotating down adjacent to the stand 3906 when not in use. Alternatively, if the handle grip 4100 is tightly fit to the end recess 3916, or fit with an indexing mechanism or other positional fixing hardware, the handle grip can be intentionally oriented relative to the computing device 3902 and the stand 3906 for various functions.

In one example, shown in FIG. 42, the handle grip 4100 can be oriented substantially vertical and in line with the stand 3906, the pivot plates 3908, 3912, and the housing 3904 of the computing device 3902. In the illustrated orientation, the overall computing system 3900 has a slimmer side profile while maintaining the floating view caused by the gap 3914 positioned between the pivot cylinder 3910 (shown in FIG. 41) and the stand 3906. Furthermore, orienting the handle grip 4100 in a substantially vertical orientation provides a relatively stable configuration for the overall computing system 3900. Specifically, according to one example, with the handle grip 4100 oriented in a substantially vertical orientation, the weight of the computing device 3902 and the stand 3906 will cause the pivot plates 3908, 3912 to close relative to one another and maintain a closed orientation. According to this example, the handle grip 4100 can be used to hang the system 3900 from a cantilevered mounting feature (e.g., from a wall mount or wall-mounted nail, hook, fastener, or similar element).

In another example orientation, illustrated in dashes in FIG. 42, the handle grip 4100 can be oriented more adjacent to the stand 3906. According to this example, the handle grip

4100 can be rotated after being used to transport or orient the computing system 3900 such that the handle grip is substantially adjacent to the stand 3906 to aid in cable management. According to one example, the handle grip 4100 can restrict, pin, guide, conceal, or otherwise orient cables that pass along the stand 3906 to the computing device 3902. While FIG. 42 illustrates the handle grip 4100 in two possible orientations relative to the stand 3906 and the computing device 3902, additional orientations can be achieved for various purposes. For example, the handle grip 4100 can be rotated past a vertical orientation to nest in, or otherwise be secured to, a corresponding recess defined by the housing 3904 of the computing device 3902.

In some embodiments, the handle grip 4100 can assume any number of sizes and/or geometries. In one example, the handle grip 4100 can be shaped and configured for cable routing from the back of the computing device 3902, wherein the openings formed by the handle grip 4100 and the pivot cylinder 3910 can be large enough to accommodate a predetermined volume of cables in addition to a user's grasping fingers. In some examples, the handle grip 4100 can be generally rectangular as shown in FIG. 41. In some examples, the handle grip 4100 can be configured to have a portion that is substantially arcuate. In some examples, the handle grip 4100 can include other ergonomic features. For example, the handle grip 4100 can include a grasping portion (i.e., the portion to be grabbed by a user) that may rotate relative to the other portions of the handle for ergonomic purposes.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A computing device, comprising:
 a housing having a rear side;
 a display device positioned in the housing; and
 a movable stand having a first segment, a second segment, a third segment, a first hinge assembly pivotally joining the first segment to the rear side of the housing, a second hinge assembly pivotally joining the first segment to the second segment, and a third hinge assembly pivotally joining the second segment to the third segment, the movable stand being movable between a first position relative to the housing and a second position relative to the housing;
 wherein in the first position, the first segment, the second segment, and the third segment are collapsed against the rear side of the housing;
 wherein in the second position, the first segment, the second segment, and the third segment are configured to support the housing on a horizontal surface with the display device in an upright orientation with the housing spaced above and separated from the third segment, with the first segment spacing the rear surface of the housing from the second segment, and with the third segment oriented parallel to the horizontal surface and contacting the horizontal surface;
 wherein the third segment is nestable into the second segment, and the first segment is nestable into the second segment.

2. The computing device of claim 1, wherein the movable stand comprises a grip opening to receive fingers of a hand of a user.

3. The computing device of claim 1, wherein in the first position, a total thickness of the movable stand lies within an overall thickness of the housing.

4. The computing device of claim 1, wherein the movable stand is positioned within a recess in the rear side of the housing.

5. A computing device, comprising:
 a housing having a front side and a rear side;
 a display screen viewable through the front side of the housing, wherein the rear side is positioned on the housing opposite the display screen;
 a stand attached to the housing and movable between a first position relative to the housing and a second position relative to the housing, the stand having a total thickness in the second position, the total thickness extending from a front-most surface of the stand to a rear-most surface of the stand;
 wherein the stand comprises a first portion, a second portion, and a third portion, wherein the first portion is nestable within a first opening in the third portion and is pivotally connected to the housing and to the third portion, wherein the second portion is nestable within a second opening in the third portion and is pivotally connected to the third portion;
 wherein in the first position, the stand supports the housing on a horizontal support surface while the housing is above and spaced away from the horizontal support surface;
 wherein in the second position, the total thickness of the stand is entirely positioned between the front side and the rear side of the housing.

6. The computing device of claim 5, wherein the stand is positioned in a recess in a rear surface of the housing.

7. The computing device of claim 5, wherein the opening has a shape following a maximum outer perimeter of the first portion.

8. The computing device of claim 5, wherein the stand comprises a grip opening.

9. The computing device of claim 5, wherein the first portion is rotatable relative to the second portion.

10. The computing device of claim 5, wherein in the first position, the stand is obscured from view in a normal viewing position of a user of the computing device.

11. The computing device of claim 5, wherein the stand comprises a weight configured to counterbalance a weight of the housing while in the first position.

12. A computing device, comprising:
 a housing having a front surface and a rear surface;
 a stand attached the housing and movable between a first position relative to the housing and a second position relative to the housing, the stand comprising a first portion, a second portion, and a third portion, the first portion being rotatably connected to the housing and being nestable into the third portion, the second portion being rotatably connected to the third portion and being nestable into the third portion;
 wherein in the first position, the stand spaces the housing away from a horizontal support surface;
 wherein in the second position, the stand is stowed against the housing and the housing is configured to be in a horizontal position with the rear surface contacting and parallel to the horizontal support surface.

13. The computing device of claim 12, wherein the stand is configured to transition from the first position to the second position in response to continual application of a force to a single point on the front surface of the housing, wherein the force moves the housing and the stand from the first position to the second position, wherein the point is positioned on the front surface vertically above the hinge attaching the stand to the housing.

14. The computing device of claim 12, wherein in the first position, the housing is in a standing position.

15. The computing device of claim 12, wherein the housing is configured to rotate relative to the stand between the first and second positions.

16. The computing device of claim 12, wherein the stand is positioned in a recess in the housing in the second position.

17. The computing device of claim 12, wherein the stand comprises a grip opening, wherein the grip opening is configured to be graspable when the stand is in the second position.

* * * * *